(12) United States Patent
Driscoll et al.

(10) Patent No.: US 10,459,016 B2
(45) Date of Patent: Oct. 29, 2019

(54) ELECTRICAL NETWORK TOPOLOGY DETERMINATION

(71) Applicant: Itron, Inc., Liberty Lake, WA (US)

(72) Inventors: Timothy James Driscoll, Raleigh, NC (US); Hartman Van Wyk, Montloius sur Loire (FR); Robert Sonderegger, Oakland, CA (US); Chris Higgins, Wake Forest, NC (US)

(73) Assignee: Itron, Inc., Liberty Lake, WA (US)

( * ) Notice: Subject to any disclaimer, the term of this patent is extended or adjusted under 35 U.S.C. 154(b) by 108 days.

(21) Appl. No.: 15/831,028

(22) Filed: Dec. 4, 2017

(65) Prior Publication Data

US 2018/0156851 A1 Jun. 7, 2018

Related U.S. Application Data

(63) Continuation of application No. 14/558,571, filed on Dec. 2, 2014, now Pat. No. 9,835,662.

(51) Int. Cl.
*G01R 25/00* (2006.01)
*G01D 4/00* (2006.01)

(52) U.S. Cl.
CPC ............ *G01R 25/00* (2013.01); *G01D 4/002* (2013.01); *G01D 4/004* (2013.01); *G01D 4/006* (2013.01);
(Continued)

(58) Field of Classification Search
CPC ....... G01R 25/00; Y04S 20/322; Y04S 20/32; Y04S 20/48; Y04S 20/325; Y04S 20/42
See application file for complete search history.

(56) References Cited

U.S. PATENT DOCUMENTS

| 4,146,841 A | 3/1979 | McRae |
| 4,532,471 A | 7/1985 | Hurley |

(Continued)

FOREIGN PATENT DOCUMENTS

| DE | 102008044915 | 3/2010 |
| DE | 102013106393 | 12/2013 |

(Continued)

OTHER PUBLICATIONS

The Australian Office Action dated May 17, 2018 for Australian Patent Application No. 2017202822, a counterpart foreign application of U.S. Appl. No. 13/560,078, 2 pages.

(Continued)

*Primary Examiner* — Dominic E Hawkins
(74) *Attorney, Agent, or Firm* — Lee & Hayes, P.C.

(57) ABSTRACT

Determination of electrical network topology and connectivity are described herein. A zero-crossing is indicated at a time when the line voltage of a conducting wire in an electrical grid is zero. Such zero-crossings may be used to measure time within a smart grid, and to determine the connectivity of, and the electrical phase used by, particular network elements. A first meter may receive a phase angle determination (PAD) message, including zero-crossing information, sent from a second meter, hereafter called a reference meter. The first meter may compare the received zero-crossing information to its own zero-crossing information. A phase difference may be determined between the first meter and the reference meter from which the PAD message originated. The first meter may pass the PAD message to additional meters, which propagate the message through the network. Accordingly, an electrical phase used by meters within the network may be determined.

20 Claims, 12 Drawing Sheets

(52) U.S. Cl.
CPC ........... *Y02B 90/241* (2013.01); *Y02B 90/242* (2013.01); *Y02B 90/243* (2013.01); *Y02B 90/246* (2013.01); *Y04S 20/32* (2013.01); *Y04S 20/322* (2013.01); *Y04S 20/325* (2013.01); *Y04S 20/42* (2013.01); *Y04S 20/48* (2013.01)

(56) References Cited

U.S. PATENT DOCUMENTS

| | | | |
|---|---|---|---|
| 4,930,064 | A | 5/1990 | Tanaka et al. |
| 5,184,119 | A | 2/1993 | Stanbury et al. |
| 5,617,329 | A | 4/1997 | Allison et al. |
| 5,673,196 | A | 9/1997 | Hoffman et al. |
| 5,831,423 | A * | 11/1998 | Mancini ............... G01R 25/00 324/76.77 |
| 5,920,720 | A | 7/1999 | Toutonghi et al. |
| 6,334,050 | B1 | 12/2001 | Skarby |
| 6,456,097 | B1 | 9/2002 | Sutherland |
| 7,272,518 | B2 | 9/2007 | Bickel et al. |
| 7,523,185 | B1 | 4/2009 | Ng |
| 7,583,197 | B2 | 9/2009 | Wesby Van Swaay |
| 7,936,163 | B2 | 5/2011 | Lee, Jr. |
| 8,094,010 | B2 | 1/2012 | Wesby-van Swaay |
| 8,283,911 | B1 | 10/2012 | Bierer |
| 8,301,386 | B1 | 10/2012 | Redmond et al. |
| 8,407,016 | B2 * | 3/2013 | Slota ................. H02J 3/42 700/286 |
| 8,639,391 | B1 | 1/2014 | Alberth, Jr. et al. |
| 8,797,018 | B2 | 8/2014 | Watkins et al. |
| 9,031,800 | B2 | 5/2015 | Filippenko et al. |
| 9,230,429 | B2 | 1/2016 | McKinley et al. |
| 9,924,242 | B2 | 3/2018 | Van Wyk |
| 2005/0063317 | A1 | 3/2005 | Risberg et al. |
| 2005/0177646 | A1 | 8/2005 | Kawano et al. |
| 2006/0071776 | A1 | 4/2006 | White II, et al. |
| 2006/0167981 | A1 | 7/2006 | Bansod et al. |
| 2007/0247331 | A1 | 10/2007 | Angelis et al. |
| 2008/0089390 | A1 | 4/2008 | Picard |
| 2009/0045976 | A1 | 2/2009 | Zoldi et al. |
| 2009/0058088 | A1 | 3/2009 | Pitchford et al. |
| 2009/0276170 | A1 | 11/2009 | Bickel |
| 2009/0299660 | A1 | 12/2009 | Winter |
| 2010/0002348 | A1 | 1/2010 | Donolo et al. |
| 2010/0060259 | A1 * | 3/2010 | Vaswani ............... G01R 29/18 324/86 |
| 2010/0088431 | A1 | 4/2010 | Oshins et al. |
| 2010/0134089 | A1 | 6/2010 | Uram et al. |
| 2010/0142447 | A1 | 6/2010 | Schlicht et al. |
| 2011/0116387 | A1 | 5/2011 | Beeco et al. |
| 2011/0122798 | A1 | 5/2011 | Hughes et al. |
| 2011/0126176 | A1 | 5/2011 | Kandasamy et al. |
| 2011/0215945 | A1 | 9/2011 | Peleg et al. |
| 2011/0254525 | A1 | 10/2011 | Gaknoki et al. |
| 2012/0041696 | A1 | 2/2012 | Sanderford, Jr. et al. |
| 2012/0117392 | A1 | 5/2012 | Turicchi, Jr. et al. |
| 2012/0126636 | A1 | 5/2012 | Atsumi |
| 2012/0169300 | A1 | 7/2012 | Rouaud et al. |
| 2012/0181974 | A1 | 7/2012 | Kuniyosi et al. |
| 2012/0198037 | A1 | 8/2012 | Shelby et al. |
| 2012/0201195 | A1 | 8/2012 | Rausch et al. |
| 2012/0229089 | A1 | 9/2012 | Bemmel et al. |
| 2013/0024149 | A1 | 1/2013 | Nayar et al. |
| 2013/0035885 | A1 | 2/2013 | Sharon et al. |
| 2013/0076534 | A1 | 3/2013 | Conant et al. |
| 2013/0101003 | A1 | 4/2013 | Vedantham et al. |
| 2013/0110425 | A1 | 5/2013 | Sharma et al. |
| 2013/0241746 | A1 | 9/2013 | McKinley et al. |
| 2013/0242867 | A1 | 9/2013 | Bell |
| 2013/0275736 | A1 | 10/2013 | Kelley et al. |
| 2013/0278437 | A1 | 10/2013 | Wyk |
| 2013/0335062 | A1 | 12/2013 | de Buda et al. |
| 2014/0005964 | A1 | 1/2014 | Rouaud et al. |
| 2014/0012524 | A1 | 1/2014 | Flammer, III |
| 2014/0032506 | A1 | 1/2014 | Hoey et al. |
| 2014/0039818 | A1 | 2/2014 | Arya et al. |
| 2014/0049109 | A1 | 2/2014 | Kearns et al. |
| 2014/0161114 | A1 | 6/2014 | Shuey |
| 2014/0173600 | A1 | 6/2014 | Ramakrishnan Nair |
| 2014/0214218 | A1 | 7/2014 | Eldridge et al. |
| 2014/0330955 | A1 | 11/2014 | Bishop et al. |
| 2014/0337429 | A1 | 11/2014 | Asenjo et al. |
| 2014/0368189 | A1 | 12/2014 | Bernheim et al. |
| 2015/0052088 | A1 | 2/2015 | Arya et al. |
| 2015/0103672 | A1 | 4/2015 | Stuart |
| 2015/0200713 | A1 * | 7/2015 | Hui ................. H04B 3/544 370/254 |
| 2015/0241482 | A1 | 8/2015 | Sonderegger |
| 2015/0241488 | A1 | 8/2015 | Sonderegger |
| 2015/0253367 | A1 * | 9/2015 | Flammer, III ......... G01R 25/00 324/76.77 |
| 2015/0280782 | A1 | 10/2015 | Airbinger et al. |
| 2015/0377949 | A1 | 12/2015 | Ramirez |
| 2016/0109491 | A1 | 4/2016 | Kann |
| 2016/0109497 | A1 | 4/2016 | Aiello et al. |
| 2016/0142514 | A1 | 5/2016 | Stuber et al. |
| 2016/0154040 | A1 | 6/2016 | Driscoll et al. |
| 2016/0173237 | A1 | 6/2016 | Braun et al. |
| 2016/0352103 | A1 | 12/2016 | Aiello et al. |
| 2017/0168098 | A1 | 6/2017 | Aiello et al. |
| 2018/0213304 | A1 | 7/2018 | Van Wyk |

FOREIGN PATENT DOCUMENTS

| | | |
|---|---|---|
| EP | 1460801 | 9/2004 |
| GB | 2426596 | 11/2006 |
| JP | 06273200 | 9/1994 |
| JP | 2000175358 | 6/2000 |
| JP | 2000249730 | 9/2000 |
| JP | 2004340767 | 12/2004 |
| JP | 2012016270 | 1/2012 |
| JP | 2012058233 | 3/2012 |
| JP | 2012521596 | 9/2012 |
| JP | 2014079138 | 5/2014 |
| JP | 2015076994 | 4/2015 |
| JP | 2015107012 | 6/2015 |
| WO | WO2007063180 | 6/2007 |
| WO | WO2009061291 | 5/2009 |
| WO | WO2010105038 | 9/2010 |
| WO | WO2010110787 | 9/2010 |
| WO | WO2014124318 | 8/2014 |

OTHER PUBLICATIONS

The Australian Office Action dated Jun. 15, 2018 for Australian Patent Application No. 2016266732, a counterpart foreign application of U.S. Appl. No. 15/058,112, 3 pages.

Office Action for U.S. Appl. No. 15/431,473, dated May 14, 2018, Aiello, "Electrical Phase Identification", 7 pages.

The European Office Action dated Jan. 3, 2019 for Eurpoean Patent Application No. 15802317.6, a counterpart foreign application of the U.S. Pat. No. 9,781,231, 5 pages.

The European Office Action dated Dec. 4, 2018 for European Patent Application No. 15710638.6, a counterpart of U.S. Appl. No. 14/280,286, 6 pages.

Office Action for U.S. Appl. No. 14/302,617, dated Jan. 11, 2019, Robert Sonderegger, "Detection of Electric Power Diversion", 35 pages.

The Australian Office Action dated Nov. 24, 2017 for Australian Patent Application No. 2015358521, a counterpart foreign application of U.S. Appl. No. 14/558,571, 3 pages.

The Australian Office Action mailed Mar. 17, 2017 for Australian Patent Application No. 2015223145, a counterpart foreign application of U.S. Appl. No. 14/280,286, 4 pages.

The Australian Office Action dated Aug. 23, 2017 for Australian Patent Application No. 2015223053, a counterpart foreign application of U.S. Appl. No. 14/302,617, 10 pages.

Berthier et al., "Intrusion detection for advanced metering infrastructures: Requirements and architectural directions", In Smart Grid Communications (SmartGridComm), 2010 First IEEE International Conference on Oct. 4, 2010, pp. 350-355.

(56) References Cited

OTHER PUBLICATIONS

The Canadian Office Action dated Oct. 26, 2016 for Canadian patent applicatoin No. 2863596, a counterpart foreign application of U.S. Appl. No. 13/560,078, 3 pages.
Do, et al., "Open-Source Testing Tools for Smart Grid Communication Network", 2013 IEEE Conference on Open Systems (ICOS), Dec. 2, 2013, pp. 156-161, retrieved on Feb. 7, 2014.
The Extended European Search Report dated Sep. 6, 2012 for European patent application No. 12165026.1, 6 pages.
Final Office action for U.S. Appl. No. 13/560,078, dated Feb. 24, 2017, Hartman et al., "Automatic Network Topology Detection and Fraud Detection", 33 pages.
Handley, et al., "ComEd Corrects Meter-Transformer Mismatches" ComEd Paper, Sep. 7, 2016, 8 pages.
"Health Device Profile", Medical Devices WG, Internet citation, Jun. 26, 2008, pp. 1-44, retrieved from the internet on Nov. 9, 2015 at URL:https://www.bluetooth.org/docman/handlers/DownloadDoc. ashx?doc_id=260864&vId=290095&_ga=1.128761092.961309788. 1447059724.
Hughes, "Augmenting AMI to Radically Reduce Electricity Theft", Metering International, Issue 1, Jan. 1, 2011, pp. 80-83, retrieved from the internet on May 20, 2015 at http://www.metering.com/wp-content/uploads/2013/10/MI-1-2-11.pdf.
Translated the Japanese Office Action dated Oct. 28, 2014 for Japanese patent application No. 2014-511377, a counterpart foreign application of U.S. Appl. No. 13/560,078, 5 pages.
Translated the Japanese Office Action dated Apr. 22, 2014 for Japanese patent application No. 2014-511377, a counterpart foreign application of U.S. Appl. No. 13/560,078, 6 pages.
The Japanese Office Action dated Aug. 29, 2017 for Japanese Patent Application No. 2016-553886, a counterpart foreign application of U.S. Appl. No. 14/302,617.
The Japanese Office Action dated Sep. 12, 2017 for Japanese patent application No. 2016-553860, a counterpart foreign application of U.S. Appl. No. 14/280,286.
Keisuke Sugiura, Mitsubishi Electric Research Laboratories, Information Processing Society of Japan, 2013, pp. 4-513-4-514.
Madden, et al., "TinyDB: An Acquisitional Query Processing System for Sensor Networks", ACM Transactions on Database Systems, vol. 30, No. 1, Mar. 1, 2005, pp. 122-173.
Maqousi, et al., "Towards an Open Architecture for Smart Grid Communications: Possible Pointers from Multiservice Network Research", 2013 1st International Conference & Exhibition on the Applications of Information Technology to Renewable Energy Processes and Systems, IEEE, May 29, 2013, pp. 114-118, retrieved on Aug. 29, 2013.
Moritz et al., "A CoAP based SOAP Transport Binding", IEEE Conference on Emerging Technologies and Factory Automation (ETFA'2011), Sep. 2011, 4 pages.
Office action for U.S. Appl. No. 13/560,078, dated Oct. 2, 2015, Van Wyk, "Automatic Network Topology Detection and Fraud Detection", 29 pages.
Final Office Action for U.S. Appl. No. 13/560,078, dated Oct. 6, 2014, Hartman Van Wyk, "Automatic Network Topology Detection and Fraud Detection", 34 pages.
Office action for U.S. Appl. No. 13/560,078, dated Dec. 16, 2013, Van Wyk, "Automatic Network Topology Detection and Fraud Detection", 23 pages.
Office Action for U.S. Appl. No. 13/560,078, dated Feb. 13, 2015, Hartman Van Wyk, "Automatic Network Topology Detection and Fraud Detection", 22 pages.
Office action for U.S. Appl. No. 14/280,286, dated Feb. 16, 2016, Sonderegger, "Smart Grid Topology Estimator", 19 pages.
Office action for U.S. Appl. No. 13/560,078, dated Feb. 24, 2017, Van Wyk, "Automatic Network Topology Detection and Fraud Detection", 32 pages.
Office action for U.S. Appl. No. 14/280,286, dated Mar. 17, 2017, Sonderegger, "Smart Grid Topology Estimator", 13 pages.

Office action for U.S. Appl. No. 14/558,571, dated Mar. 9, 2017, Driscoll, "Electrical Network Topology Determination", 15 pages.
Final Office Action for U.S. Appl. No. 13/560,078, dated Jul. 1, 2015, Hartman Van Wyk, "Automatic Network Topology Detection and Fraud Detection", 23 pages.
Office Action for U.S. Appl. No. 14/518,564, dated Jul. 20, 2017, Kann, "Grid Topology Mapping With Voltage Data", 18 pages.
Office action for U.S. Appl. No. 14/547,561, dated Jul. 29, 2016, Stuber, "Application Platform Operable on Network Node", 33 pages.
Office action for U.S. Appl. No. 14/280,286, dated Aug. 11, 2017, Sonderegger, "Smart Grid Topology Estimator", 15 pages.
Office action for U.S. Appl. No. 13/560,078 , dated Aug. 15, 2013, Van Wyk, "Automatic Network Topology Detection and Fraud Detection", 16 pages.
Final Office Action for U.S. Appl. No. 14/280,286, dated Aug. 4, 2016, Robert Sonderegger, "Smart Grid Topology Estimator ", 20 pages.
"Open Smart Grid Protocol (OSGP); draft ETSI GS OSG 001", European Telecommunications Standards Institute (ETSI), France, vol. zArchive-ISG, No. VO.1.2, Nov. 15, 2011, pp. 1-250, retrieved on Nov. 15, 2011.
The PCT Search Report and Written Opinion dated Jan. 28, 2016 for PCT application No. PCT/US2015/056482, 10 pages.
The PCT Search Report dated Jan. 31, 2013 for PCT application No. PCT/US12/34697, 9 pages.
PCT Search Report and Written Opinion dated Oct. 20, 2015 for PCT Application No. PCT/US15/44191, 11 pages.
The PCT Search Report and Written Opinion dated Feb. 18, 2016 for PCT application No. PCT/US20165/063512, 13 page.
The PCT Search Report and Written Opinion dated Mar. 2, 2016 for PCT application No. PCT/US2015/061390, 15 pages.
The PCT Search Report and Written Opinion dated May 22, 2015 for PCT application No. PCT/US2015/017571, 9 pages.
The PCT Search Report and Written Opinion dated Jun. 1, 2015 for PCT Application No. PCT/US2015/017575.
The PCT Search Report and Written Opinion dated Jul. 7, 2016 for PCT application No. PCT/US2016/030144, 12 pages.
Regehr et al.,"TinyOS 2.1 Adding Threads and Memory Protection to TinyOS", proceedings of the 6th ACM conference on Embedding Network Sensor Systems (SenSys'08), Apr. 2008, 2 pages.
Sharon, et al., Topology Identification in Distribution Network with Limited Measurements, Inovative Smart Grid Technology Conference, Jan. 16-20, 2012, IEEE, pp. 1-6.
Short, "Advanced Metering for Phase Identification, Transformer Identification, and Secondary Modeling", IEEE Transactions on Smart Grid, IEEE, USA, vol. 4, No. 2, Jun. 1, 2013, pp. 651-658.
Snell, "Call SOAP Web services with Ajax Part 1: Build the Web services client", IBM Corporation developerWorks, Oct. 2005, 13 pages.
Australian Examination Report dated Apr. 28, 2016, for Australian Patent Application No. 2012377368, a counterpart application of U.S. Appl. No. 13/560,078,3 pages.
The Australian Office Action dated Jan. 10, 2018 for Australian patent application No. 2015349942, a counterpart foreign application of U.S. Pat. No. 9,781,231, 3 pages.
The Australian Office Action dated Jan. 5, 2018 for Australian Patent Application No. 2017202822, a counterpart foreign application of U.S. Appl. No. 13/560,078, 3 pages.
The Australian Office Action dated Dec. 15, 2017 for Australian Patent Application No. 2015336081, a counterpart foreign application of U.S. Pat. No. 9,568,522, 3 pages.
The Australian Office Action dated Feb. 6, 2018 for Australian patent application No. 2015337110, a counterpart foreign application of U.S. Appl. No. 14/518,564, 3 pages.
Communication pursuant to Article 94(3) EPC dated Jul. 29, 2016, for EP Application No. 12165026.1, a counterpart application of U.S. Appl. No. 13/560,078, 6 pages.
Office Action for U.S. Appl. No. 14/302,617, dated Jan. 5, 2018, Sonderegger, "Detection of Electric Power Diversion", 29 pages.
Office Action for U.S. Appl. No. 15/431,473, dated Dec. 29, 2017, Kann, "Electrical Phase Identification", 7 pages.

(56) References Cited

OTHER PUBLICATIONS

Office Action for U.S. Appl. No. 14/518,564, dated Dec. 7, 2017, Kann, "Grid Topology Mapping With Voltage Data", 19 pages.

Office action for U.S. Appl. No. 14/280,286, dated Feb. 1, 2018, Sonderegger, "Smart Grid Topology Estimator", 20 pages.

The Australian Office Action dated Feb. 26, 2018 for Australian Patent Application No. 2015223145, a counterpart foreign application of U.S. Appl. No. 14/280,286, 3 pages.

Copy of the Australian Office Action dated Feb. 6, 2018 for Australian patent application No. 2015337110, a counterpart foreign application of U.S. Appl. No. 14/518,564, 3 pages.

The Canadian Office Action dated Feb. 26, 2018 for Canadian patent application No. 2965101, a counterpart foreign application of U.S. Appl. No. 14/518,564, 3 pages.

The Canadian Office Action dated Apr. 9, 2018 for Canadian patent application No. 2969685, a counterpart foreign application of U.S. Pat. No. 9,835,662, 4 pages.

The Japanese Office Action dated Apr. 24, 2018 for Japanese Patent Application No. 2016-553860, a counterpart foreign application of U.S. Appl. No. 14/280,286.

The Japanese Office Action dated Apr. 3, 2018 for Japanese Patent Application No. 2016-553886, a counterpart foreign application of U.S. Appl. No. 14/302,617.

Office Action for U.S. Appl. No. 15/058,112, dated Mar. 29, 2018, Aiello, "Automatic Network Device Electrical Phase Identification", 14 pages.

The Australian Office Action dated Oct. 25, 2018 for Australian Patent Application No. 2017202822, a counterpart foreign application of U.S. Pat. No. 9,924,242, 5 pages.

The Canadian Office Action dated Oct. 2, 2018, for Canadian patent Application No. 2987580, a counterpart foreign patent application of the U.S. Appl. No. 15/058,112, 9 pages.

The European Office Action dated Sep. 17, 2018, for European Patent Application No. 15710639.4, a counterpart foreign application of U.S. Appl. No. 14/302,617, 10 pages Office Action for U.S. Appl. No. 15/925,651, dated Oct. 2, 2018, Van Wyk, "Automatic Network Topology Detection and Fraud Detection," 24 pages.

Office action for U.S. Appl. No. 14/280,286, dated Sep. 11, 2018, Sonderegger, "Smart Grid Topology Estimator", 21 pages.

Office Action for U.S. Appl. No. 14/302,617, dated Sep. 18, 2018, Robert Sonderegger, "Detection of Electric Diversion", 39 pages.

The Australian Office Action dated Feb. 12, 2019 for Australian Patent Application No. 2018201911, a counter part of U.S. Appl. No. 14/280,286, 3 pages.

The European Office Action dated Feb. 21, 2019 for European Patent Application No. 16722992.1, a counterpart of U.S. Appl. No. 15/058,112, 5 pages.

The Japanese Office Action dated Feb. 12, 2019 for Japanese Patent Application No. 2016-553686, a counterpart of U.S. Appl. No. 14/302,617, 1 page.

Office action for U.S. Appl. No. 14/280,286, dated Feb. 14, 219, Sonderegger, "Smart Grid Topology Estimator", 16 pages.

\* cited by examiner

ELECTRICAL NETWORK TOPOLOGY DETERMINATION

RELATED APPLICATION

This application is a continuation of and claims priority to U.S. patent application Ser. No. 14/558,571, filed on Dec. 2, 2014, which is incorporated by reference herein in its entirety.

BACKGROUND

Analytical software running at a head office and applications running on smart meters and other devices within a smart grid provide increasingly sophisticated analyses of data to better manage electrical distribution. Aggregating data from smart meters allows utility companies to perform analyses that anticipate bottlenecks, avoid power failures, and generally optimize grid operation.

However, performing the sophisticated analyses and leveraging the information obtained from smart meters and other network nodes requires an accurate knowledge of network topology, including which meters and electrical phases are connected to each transformer. Unfortunately, utility and distribution companies may not maintain connectivity information for individual meters. In the event that such information is collected, it may be poorly maintained and error-prone. Line workers may change connections under time pressure to alleviate local power problems without appropriately updating records. Because transformers, meters and other infrastructure may stay in service for decades, errors within the connectivity information can accumulate. Without an accurate record of network topology, smart grid analytics, applications and other functionality may be degraded.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

This disclosure describes techniques for determining network topology and electrical phase use. In an electrical grid, electrical power is typically distributed in three phases. Each of the three power phases may include a sinusoidal voltage level that is offset from each of the other two phases by 120 degrees. Individual transformers may be connected to one or more of the three available power phases in a manner that distributes load over the phases evenly. However, utility companies may not know which transformers and meters are connected to each power phase.

In one example of the techniques discussed herein, values by which each of a plurality of nodes (transformers, electric meters, switches and other network devices) in a network differs in phase angle from a reference node may be determined. If the specific phase of the reference node is known, it may be used to determine the specific phase of the other network devices.

Example Networks

Figure 1:
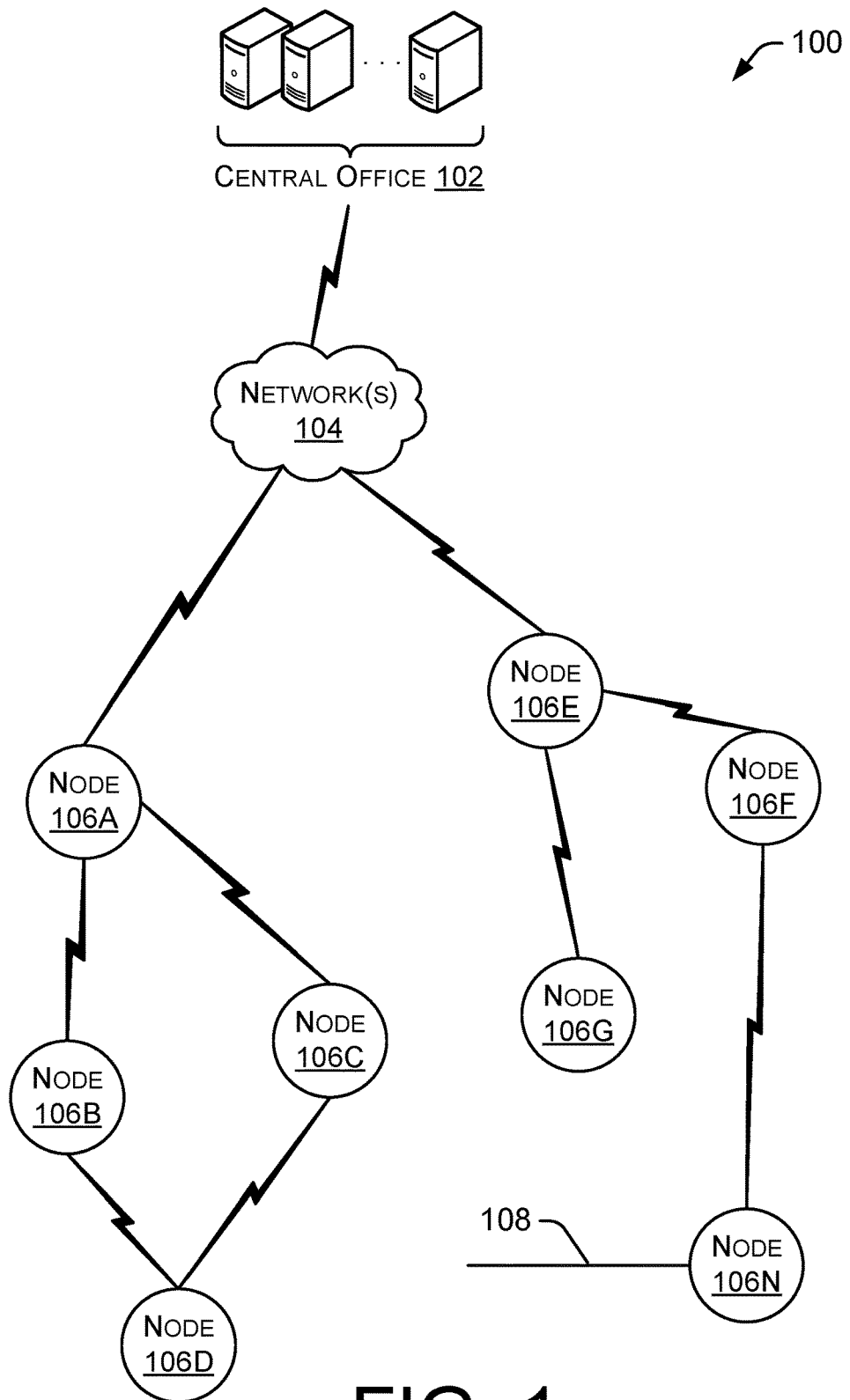
FIG. 1 is a diagram showing an example mesh network, wherein a plurality of metering devices or other network nodes are configured for electrical network topology determination and are in communication with a central office.

FIG. 1 shows an example mesh network 100 configured for electrical network topology determination. In the example shown, a plurality of utility consumption metering devices or other network nodes are in communication with a central office 102, such as by using radio frequency (RF) transmissions, power line communications (PLC), or other technology. While a mesh network is shown, portions of the communications may be performed by other networks 104, such as the Internet. A plurality of nodes 106A . . . 106N may relay information within the mesh, which may include transmissions in one or both directions (upstream toward the central office and/or downstream toward a child or leaf node). The central office 102 may be configured to include collection engine (CE) functionality. In some implementations, aspects of the CE functionality may be distributed, partly or fully, within some or all of the nodes 106. The central office 102 and its functionality may be centralized within a utility company, distributed among locations within the network 100, and/or located in a data center location or "cloud" environment.

Electrical power may be measured by a metrology unit associated with one or more of the nodes 106 as the power is used by a customer. In one example, power is delivered to a customer from a transformer (not shown) by an electrical conductor 108. The quantity of power that is delivered is measured by a metrology unit associated with node 106N. The metrology unit associated with node 106N is able to determine zero-crossings of the phase of the power delivered over conductor 108. As will be discussed, the zero-crossing may be used to provide timing-associated data to the node 106N, and to assist in electrical network topology and phase-use determination.

Figure 2:
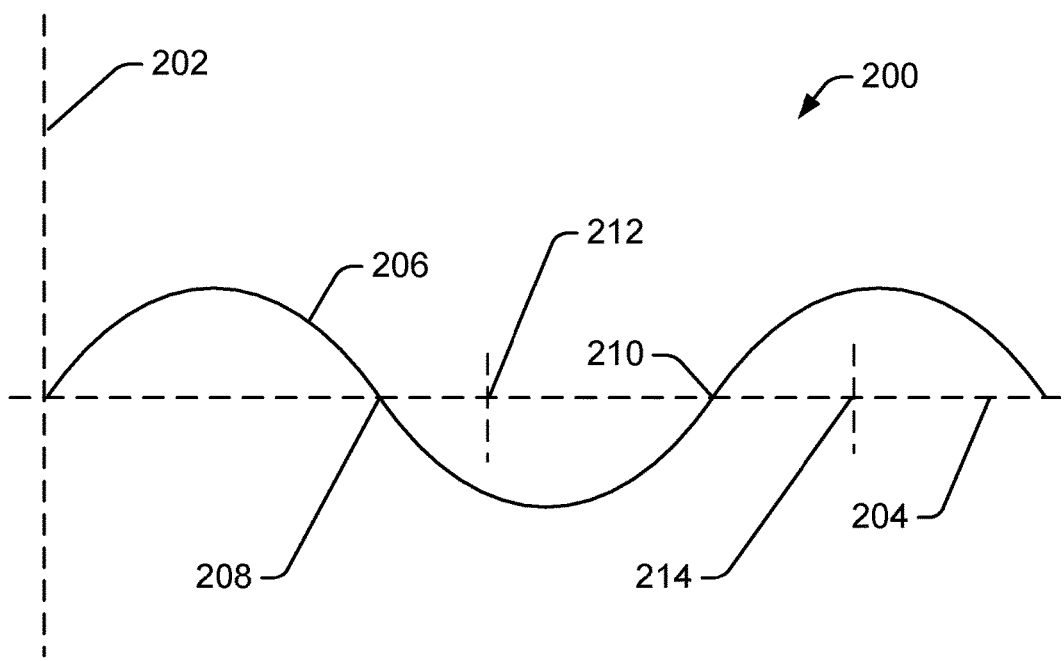
FIG. 2 shows an example relationship between line voltage in a power grid, time and a zero-crossing.

FIG. 2 shows an example relationship 200 between the voltage of a power-delivery conductor (e.g., an electrical feeder), time and a zero-crossing. In the relationship 200 shown, voltage is on the vertical axis 202 and time is on the horizontal axis 204. The voltage level 206 of one phase of three phase electrical power is shown as varying in a sinusoidal manner. The voltage level 206 crosses the zero voltage axis at 208 and 210, either of which could be considered a "zero crossing." However, for purposes of discussion herein, the zero-crossing 210, from negative to positive voltage, is selected as the zero-crossing. Accordingly, in the illustrated example, an event 212 took place before the zero-crossing 210 and an event 214 took place after the zero-crossing. In an example of zero-crossing information, a zero-crossing indicates a point in time when the voltage of one of the three phases of power crosses from negative to positive (or positive to negative, if this alternative is used). Time-passage following the zero-crossing may be expressed in degrees, milliseconds or other units until the next zero-crossing. In the example of a 60-Hertz network, wherein zero-crossings are defined by voltage crossing zero from negative to positive, zero-crossings are separated by 360 degrees or 1/60th of a second. Thus, either a positive-to-negative or a negative-to-positive voltage transition should be selected for use as a zero-crossing, and used consistently within a system.

Figure 3:
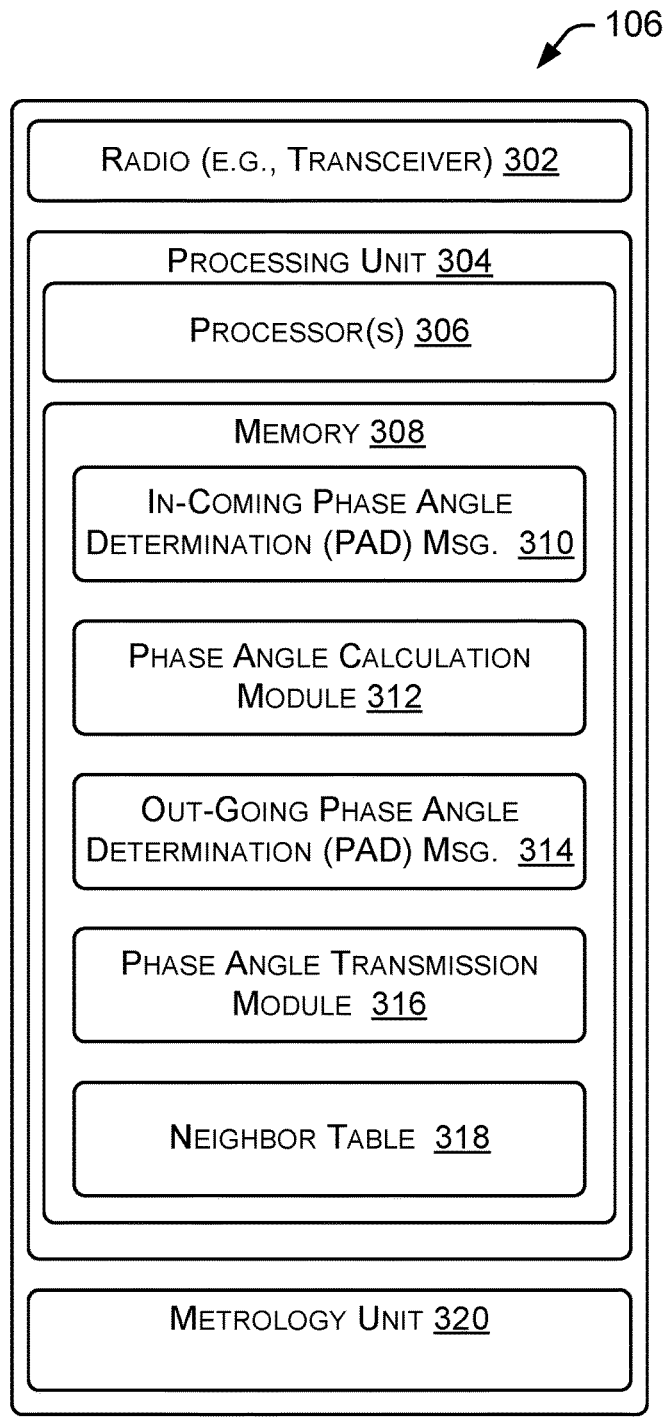
FIG. 3 is block diagram showing an example configuration of a node in a network, such as the network of FIG. 1.

FIG. 3 is block diagram showing an example configuration of a node 106 in a network, such as network 100 of FIG. 1. The node may have a radio transmitter, receiver and/or transceiver 302. The transceiver 302 may be an RF and/or PCL device. A processing unit 304 may include one or more of processor(s) 306 and memor(ies) 308. The processing unit 304 may include the functionality of a clock, for tracking time of day, and various timing and measuring tasks. The memory 308 may include one or more functional modules, as seen in the representative configuration of FIG. 3.

An incoming phase angle determination (PAD) message 310 may have been received from a neighboring node. The message 310 may be of PAD type, and may include a time of transmission by the neighbor node (which may be based on, and/or described with reference to, a zero-crossing) and may include a difference in phase angle between the message-sending meter and a reference meter.

A phase angle calculation module 312 may be configured to calculate a phase angle of an event with respect to a zero-crossing. In the context of the example of FIG. 2, phase angle calculation module 312 would calculate the phase angle from the zero-crossing 210 to the event 214. The phase angle may be calculated in degrees. In the example of FIG. 2, the value appears to be approximately 80 degrees. Alternatively, the time since a zero-crossing may be calculated in milliseconds or other units of measure.

An outgoing phase angle determination (PAD) message 314 may be include a time when the message is transmitted by the phase angle transmission module 316 (note: the time may be based on a zero-crossing) and may include a difference in phase angle between the message-sending meter and the reference meter.

A phase angle transmission module 316 may configure a PAD-type message for transmission to neighboring nodes. The PAD-type message or signal may contain a time of transmission and a phase angle. The time of transmission may be expressed with respect to a zero-crossing time, $\phi_0$. The time of transmission may be expressed in degrees, milliseconds, or other values, that have passed since the last zero-crossing (or until the next zero-crossing). Since RF and PLC communications are essentially instantaneous, messages are sent and received at almost exactly the same time. The phase angle calculation module 312 or the phase angle transmission module 316 may determine if the node has previously responded to a PAD message that originated at a same reference node and/or originated at a same time. If a response to the message has previously been sent, the phase angle calculation module 312 or phase angle transmission module 316 may prevent further response.

A neighbor table 318 (or database or other data structure) may be used to store information about nodes that are near the node 106, particularly including one-hop neighbors.

A metrology unit 320 may be configured to measure power consumed by a utility customer. Additionally, the metrology unit 320 may be configured to determine zero-crossing information of a phase of power provided to the customer.

Figure 4:
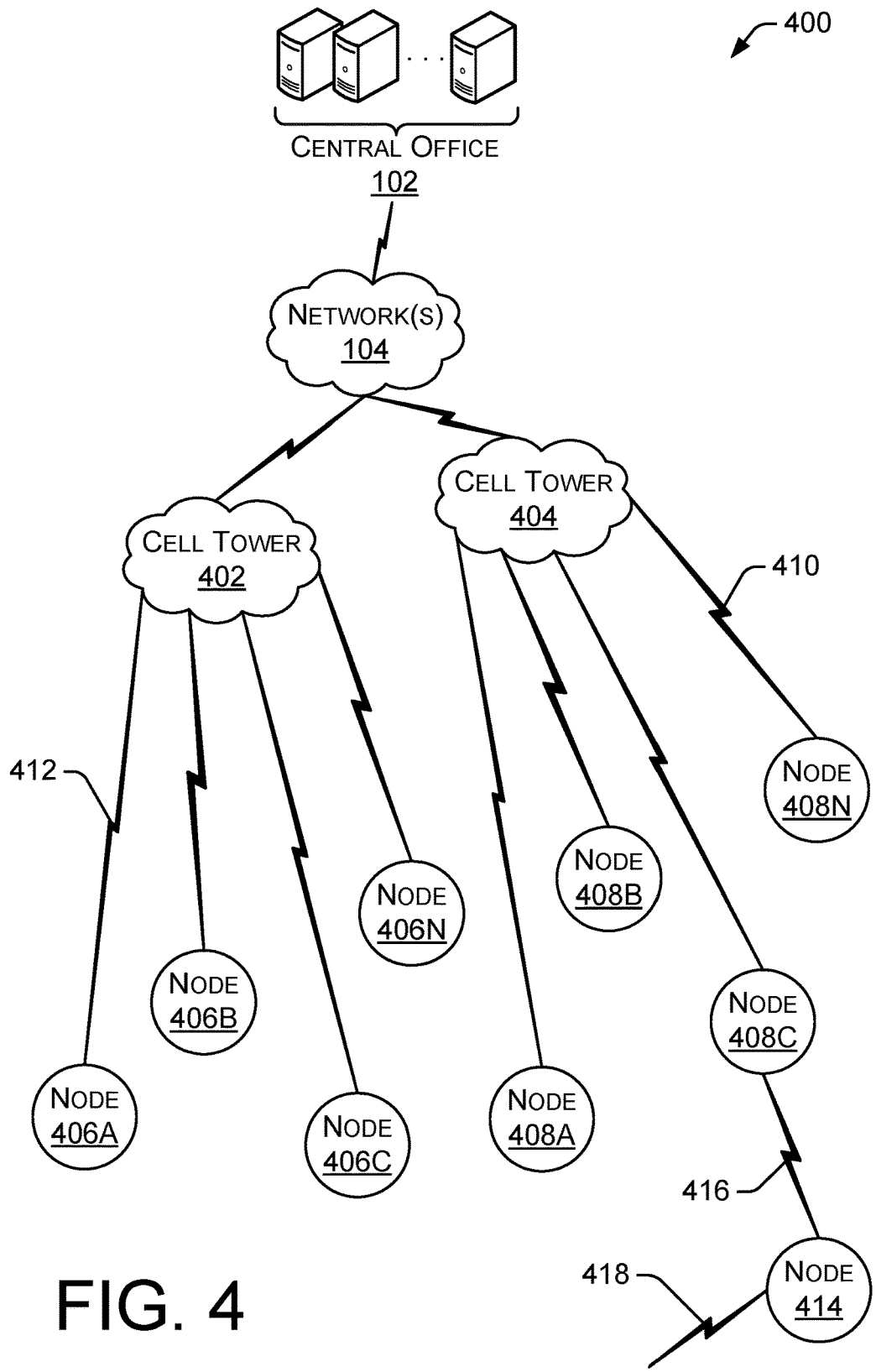
FIG. 4 is a diagram showing an example star network, wherein a plurality of metering devices or other network nodes are configured for electrical network topology determination and cellular telephone towers allow nodes to communicate with a central office.

FIG. 4 is a diagram showing an example star network 400, wherein cellular telephone towers 402, 404 allow nodes to communicate with a central office 102. A first star network is associated with cell tower 402 and comprises nodes 406A through 406N. A second star network is associated with cell tower 404 and comprises nodes 408A through 408N. Each node 406, 408 communicates with a cell tower 402, 404, respectively, using RF signals 410, 412 over appropriate frequencies and using appropriate modulation schemes.

In some cases, a node may be part of, or in communication with, both a cellular-based star network and also an RF mesh network. Such a node may provide important information to one or both networks. In the example of FIG. 4, node 408C is part of a cellular-based star network of cell tower 404 and node 414 is part of a mesh network (not shown), with which it communicates over channel 418, not associated with a cell tower. However, nodes 408C and 414 are able to communicate using RF communications techniques and channels 416 compatible with a mesh network. In such an example, the nodes 408C and 414 may include an RF receiver, transmitter and/or transceiver, which may or may not be present in other cellular-based nodes. Accordingly, nodes 408C and 414 are each effectively part of, or at least in communication with, two networks.

Example Methods and Techniques

In some examples of the techniques discussed herein, the methods of operation may be performed by one or more application-specific integrated circuits (ASIC) or may be performed by a general purpose processor utilizing software defined in computer readable media. In the examples and techniques discussed herein, the memory 308 may comprise computer-readable media and may take the form of volatile memory, such as random access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

As defined herein, computer-readable media does not include transitory media, such as modulated data signals and carrier waves, and/or signals.

Grid-Side Network Discovery

Aspects of the connectivity and/or topology, and the electrical phases used by various network components of a smart electrical network, may be determined using techniques described herein. Topological and phase information may be determined, at least in part, using information obtained from meters and/or other nodes in the network.

Grid-side network discovery techniques may be used to determine network topology and electrical phases used by network components. The techniques may utilize one or more reference meter(s) in phase angle determination (PAD) process(es) configured to reach most or all network meters/nodes. In the example of FIG. 1, meters/nodes 106A and 106E may be used as reference meters. The PAD processes may be configured to determine, for other network meters, a phase angle relative to the reference meter(s). Techniques to perform transformer phase discovery (TPD) may determine a phase to which each transformer is connected (e.g., which phase of three phase power each transformer is connected). At the end of the processes, an association of each meter to a transformer may be known. The TPD processes may be performed utilizing several different techniques. In a first example, the TPD may be performed as secondary effect of PAD, whereby for each transformer one meter receives the PAD signal before other meters associated with the transformer and re-transmits the signal by power line communication (PLC), thus enabling identification of other meters electrically connected to the transformer. In a second example, the TPD may be performed as PLC propagates data indicating unusual voltages as they occur. In a third example, the TPD may be performed as inter-meter communication by PLC at the beginning of each interrogation response. Aspects of smart grid topology may also include feeder (electrical conductor) topology discovery (FTD). In one example, FTD may employ beacon meters distributed throughout the grid.

Phase Angle Determination (PAD)

Phase angle determination (PAD) techniques may be used to determine to which of the three electrical power phases a device is attached. In one example of the techniques described herein, a distinctive "phase propagation" signal is broadcast using radio frequency (RF) and/or power line communications (PLC) from a reference meter ($M_R$). The $M_R$ may have a known phase from among the three phases of power typically used on a power grid. The phase propagation signal may have a unique "PAD type" and will contain zero-crossing information.

In an example of zero-crossing information, a zero-crossing indicates a point in time when the voltage of one of the three phases of power crosses from negative-to-positive (or positive-to-negative, if the zero-crossing has been so defined). Time-passage following the zero-crossing may be expressed in degrees, milliseconds or other units until the next zero-crossing. In the example of a 60-Hertz network, wherein zero-crossings are defined by voltage crossing zero from negative to positive (or positive to negative), zero-crossings are separated by 360 degrees or ⅙₀th of a second.

In an example of a PAD message or signal type, the signal may contain a time of transmission and a phase angle. The time of transmission may be expressed with respect to a zero-crossing time, $\phi_0$. The time of transmission may be expressed in degrees, milliseconds, or other values, that have passed since the last zero-crossing (or alternatively until the next zero-crossing). Since RF and PLC communications are essentially instantaneous, it is safe to say that messages are sent and received at the same time.

The PAD message may also include a difference between a phase angle of the MR and a phase angle of the meter sending the PAD message. The phase angle may be considered the fraction of a wave cycle that has elapsed. In an example, the phase angle is related to a voltage potential seen at a node and may be associated with a particular phase of three-phase power. Each of the three phases may be separated by 120 degrees.

Thus, the PAD message may include a time of transmission (which may be based on a zero-crossing) and may include a difference in phase angle between the message-sending meter and the reference meter. In an original PAD message sent by a reference node, the phase difference with respect to the reference node and itself will be zero. In subsequent PAD messages sent by nodes other than the reference node to other nodes within the network, the phase difference may be non-zero.

Any other meter, e.g., meter M1, that receives the broadcast directly from MR may compare its own phase angle at the time of the reference broadcast, $\phi_{R,M1}$, minus the reference meter's phase angle, and record the difference, $\Delta\phi_{0,M1}$. This may be expressed as $$\Delta\phi_{M1} = \phi_{R,M1} - \phi_0$$

The meter M1 and similarly situated meters may transmit a message that is similar to the message received from $M_R$. The transmitted message may include both the time of re-transmission, $\phi_{T,M1}$, as well as its phase angle difference with respect to the original reference meter, $\Delta\phi_{M1}$. The time of transmission may be expressed with respect to a zero-crossing. For example, the time of transmission may be expressed in degrees or milliseconds since the last zero-crossing. Any meter, e.g., meter M2, that receives this message transmitted by meter M1 may record its own phase angle at the time of broadcast by M1, $\phi_{R,M2}$, and may compute its own phase angle with respect to the reference meter as follows:

$$\Delta\phi_{M2} = \phi_{R,M2} - \phi_{T,M1} + \Delta\phi_{M1}.$$

An issue may arise if meter M2 transmits a PAD message and M1 receives it. Since meter M1 has already processed a PAD message and transmitted a PAD message to meter M2, meter M1 may be configured to ignore the transmission from meter M2. Accordingly, any meter or other network node that recognizes having previously processed the PAD message will not re-broadcast the PAD message or a derivation thereof.

The process of receiving, processing and sending PAD messages may continue until some, most or all of the nodes and/or meters in a network have participated. Accordingly, multiple groups of meters may receive, process and re-broadcast PAD messages comprising a time of transmission (expressed with reference to a zero-crossing) and a phase angle difference from a reference node or meter. However, each meter or node may perform this functionality only if it has not been previously performed by the meter or node.

As nodes and/or meters receive, process and send PAD messages, most or all meters, $M_i$, in the network record a phase angle difference, $\Delta\phi_{Mi}$, from that of the reference meter or node. This information may be used to compute the absolute phase with respect to the reference meter. In one example, the phase angle difference may be divided by 30°. The result may be rounded to the nearest integer between −11 and 11, which may be referred to as phase index (PI).

In some applications of the techniques discussed herein, the phase of the original reference meter may not be known. Accordingly, a nomenclature may be utilized to combine the ID of the reference meter with the phase index. An example of such a nomenclature is seen in Table 1.

TABLE 1

| Relative Phase: | MR0 | MR1 | MR2 | MR3 | MR4 | MR5 | MR6 | MR7 | MR8 | MR9 | MR10 | MR11 |
|---|---|---|---|---|---|---|---|---|---|---|---|---|
| PI ≥ 0 | 0 | 1 | 2 | 3 | 4 | 5 | 6 | 7 | 8 | 9 | 10 | 11 |
| PI ≤ 0 | 0 | −11 | −10 | −9 | −8 | −7 | −6 | −5 | −4 | −3 | −2 | −1 |
| Lag | 0° | +30° | +60° | +90° | +120° | +150° | +180° | +210° | +240° | +270° | +300° | +330° |
| Lead | 0° | −330° | −300° | −270° | −240° | −210° | −180° | −150° | −120° | −90° | −60° | −30° |

The first row of Table 1 shows an example of the relative phase nomenclature, with "$M_0$" replaced with the actual reference meter ID. It is possible for one meter receive a relative phase message from more than one reference meter, e.g. MS and MT. In this circumstance, the receiving meter may have multiple relative phases with respect to multiple meters from which a message was received. The multiple relative phase angles may be, for example, MR0, MS4 and MT8.

In an alternative embodiment of the techniques discussed herein, the reference node or meter may transmit an absolute phase designation (e.g., A, B, or C) as part of the initially-sent PAD-type message. In this example, receiving meters may determine their own phase more accurately by combining the letters A, B, or C, and the number 1, 2, or 3. If the example reference meter has phase A, then the combinations may include the following meanings, based on three electrical phases, each separated from the other two phases by 120 degrees.

message, process its phase difference with respect to a reference, and broadcast a further PAD message including a time of transmission (expressed with reference to a zero-crossing) and a phase angle difference from a reference node or meter. The refresh may be useful either because the electrical phase provided to the meter may have been changed, or because the meter may have lost phase information following the power outage.

Thus, a new PAD messaging process may be triggered after successful restoration of electrical power to numerous meters after a major power outage. In contrast, power outages limited to small neighborhoods may not warrant the triggering of a new PAD messaging process.

In the example of a limited outage and a small number of meters lacking phase information, the phase information may be refreshed by a statistical information propagation (SIP) process. In the SIP process, meters unaffected by the outage may experience an unusual voltage event. In response, those meters broadcast information about the unusual voltage event, and meters with uncertain phase information receive the broadcast information and use that information to reset their own phase information.

Figure 5:
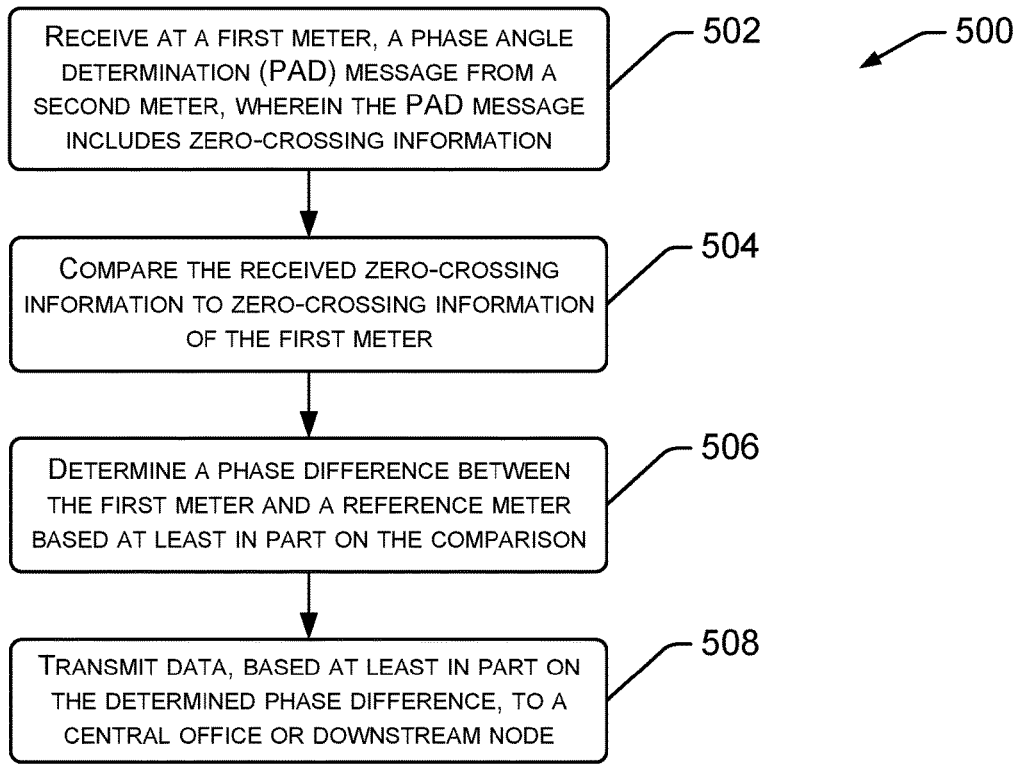
FIG. 5 is flow diagram showing example techniques by which a meter or other network node may receive and process a message of phase angle determination (PAD) type.

FIG. 5 is flow diagram showing example techniques 500 by which a meter or other network node may receive and process a message of phase angle determination (PAD) type. The meter may be configured within a mesh network environment. At block 502, a first meter receives a phase angle determination (PAD) message sent from a second meter. The PAD message may include a time of transmission (which may be based on a zero-crossing) and may include a difference in phase angle between the message-sending meter and the reference meter. At block 504, the received zero-crossing information may be compared to the zero-crossing information of the first meter. At block 506, phase difference between the first meter and a reference meter is determined, which may be based at least in part on the

TABLE 2

| Phase: | A | A1 | A2 | A3 | B | B1 | B2 | B3 | C | C1 | C2 | C3 |
|---|---|---|---|---|---|---|---|---|---|---|---|---|
| PI ≥ 0 | 0 | 1 | 2 | 3 | 4 | 5 | 6 | 7 | 8 | 9 | 10 | 11 |
| PI ≤ 0 | 0 | −11 | −10 | −9 | −8 | −7 | −6 | −5 | −4 | −3 | −2 | −1 |
| Lag | A +0° | A +30° | A +60° | A +90° | B +0° | B +30° | B +60° | B +90° | C +0° | C +30° | C +60° | C +90° |
| Lead | A −0° | B −90° | B −60° | B −30° | B −0° | C −90° | C −60° | C −30° | C −0° | A −90° | A −60° | A −30° |

The process by which PAD messages are sent through a portion of an electrical grid may take several hours, and result in each node and/or meter receiving a PAD message and calculating its phase angle difference with respect to an original reference meter. During this period, few phasing changes (changes in electrical phase used by the meter) are expected for meters. In fact, no phasing changes can occur unless there is physical switching of devices. Such physical switching may occur, for example, during restoration from an outage. In one example, a meter that experiences an electrical outage may be provided with a phase refresh. The phase refresh may allow the node or meter to receive a PAD comparison of block 504. At block 508, data based at least in part on the determined phase difference, may be transmitted to a central office or downstream node. In one example, an updated PAD message is sent to downstream node(s), containing a phase difference between a reference meter and the sending meter.

Figure 6:
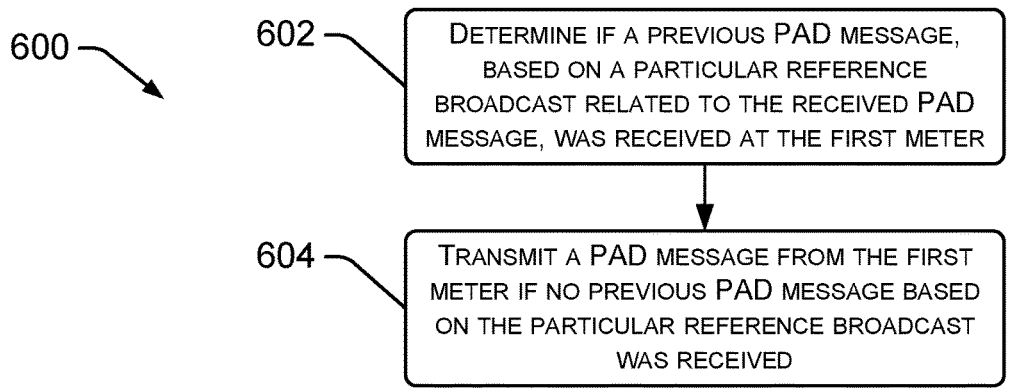
FIG. 6 is flow diagram showing example techniques by which a meter or other network node may avoid excessive retransmission of PAD type message(s).

FIG. 6 is flow diagram showing example techniques 600 by which a meter or other network node may avoid excessive retransmission of PAD type message(s). At block 602, a node may determine if a previous PAD message that was based on a particular reference broadcast is related to the received PAD message. If a reference meter sent an original PAD message, that message may create a wave of responses from meters in the network. If each meter is limited to one response, the message will not bounce back and forth between neighboring nodes. At block 604, a PAD message may be transmitted from the first meter, if no (or less than a threshold number) previous PAD message based on the particular reference broadcast was received and/or acted upon.

PAD Process for Cellular Meters

In some of the examples above, electrical meters and other network devices were configured as nodes in a mesh smart grid network. Other smart electrical grids networks may be configured in a star configuration and may utilize cellular connection between nodes and a central office, root node or other computing device. Meters using cellular connectivity may not have the configurations needed to compare zero-crossing times with a reference meter and may not be configured to propagate phase information through the statistical information propagation (SIP) process. To determine phase angles at each node in the star network, different processes may be utilized.

Figure 7:
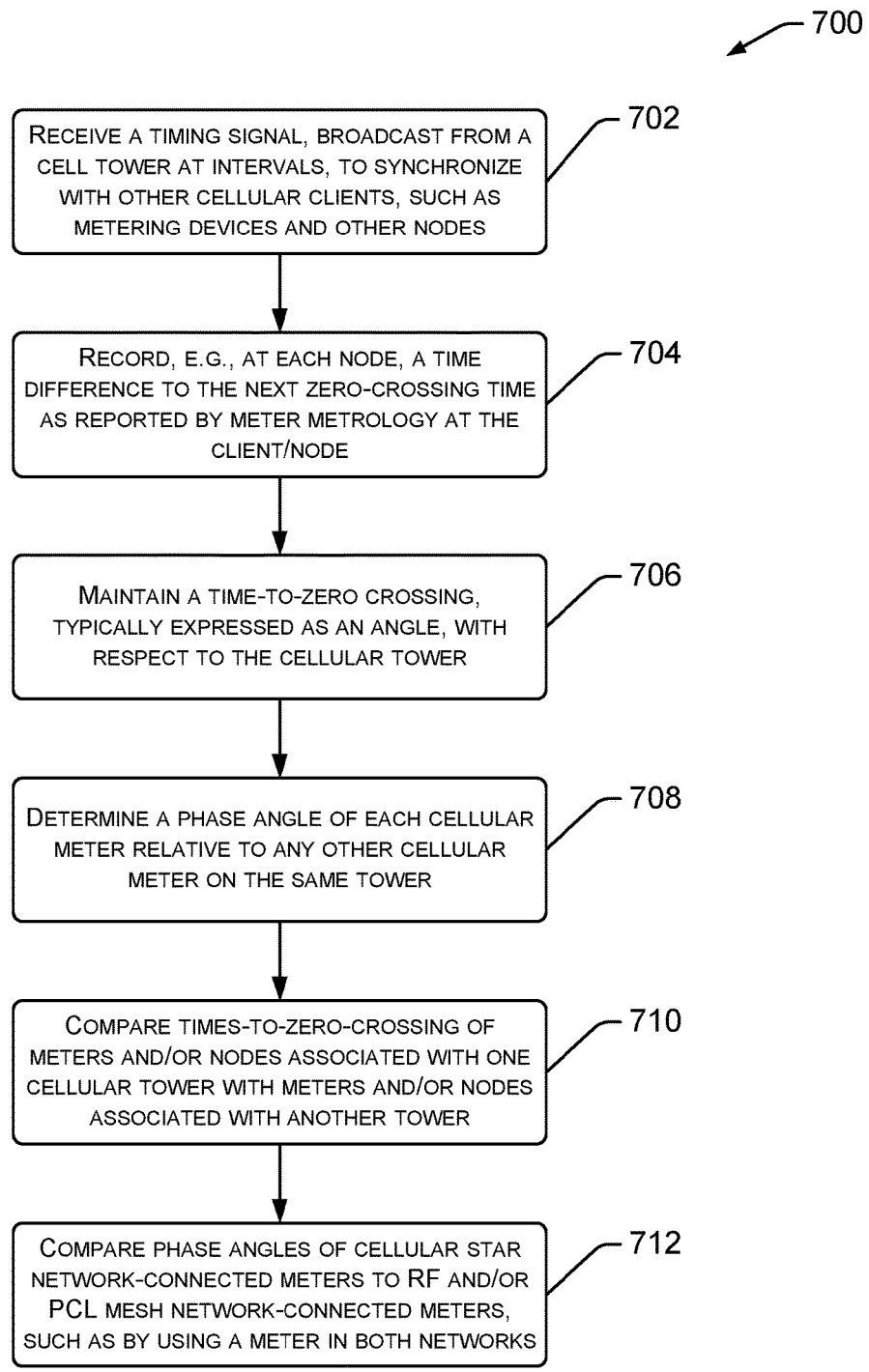
FIG. 7 is flow diagram showing example techniques utilizing a star network, wherein functionality analogous to a reference meter in a mesh network may be performed by one or more cell towers or cell facilities.

In the examples utilizing a mesh network of utility meters or nodes, a reference meter is utilized to send an initial PAD message including a reference time (with respect to a zero-crossing) and a reference phase angle. FIG. 7 shows example techniques 700 utilizing a star network (e.g., star network 400 of FIG. 4), wherein functionality analogous to the reference meter may be performed by one or more cell towers or cell facilities. In example star networks, a meter may communicate with one or more cell towers. At block 702, nodes may receive timing signals at intervals, which may be broadcast from one or more cellular towers. The signals may be programmed to synchronize some or all cellular clients, such as metering devices and other network nodes. Clients on a tower may rely on having received the same signal from a specific tower at the same time as other clients. Accordingly, at block 704, nodes (cell clients) can record a time difference to the next zero-crossing time (or since the previous zero-crossing) as reported by meter metrology at the client/node. At block 706, cellular meters within range of the same tower may maintain a time-to-zero crossing, typically expressed as an angle, with respect to the cellular tower. At block 708, a phase angle of each cellular meter may be determined relative to any other cellular meter on the same tower.

In some implementations, meters within range of more than one cellular tower may retain time-to-zero-crossing angles for each tower. At block 710, a comparison may be performed of times-to-zero-crossing of meters and/or nodes associated with one cellular tower, as compared with meters and/or nodes associated with another tower.

In some implementations, a cell-connected meter and/or node may be found to be on the same transformer, feeder or phase used by an RF and/or PLC mesh network-connected meter. At block 712, meters having such a relationship may assist in the comparison of phase angles of cellular star network-connected meters to RF and/or PCL mesh network-connected meters.

In one example, a cellular-based meter receives a timing signal, which may have been broadcast from a cell tower at intervals. The signal is used to synchronize with other cellular clients, such as metering devices and network nodes. The cellular-based meter records a time-to-zero-crossing of the timing signal using meter metrology to obtain a zero crossing. The cellular-based meter maintains the time-to-zero-crossing. The cellular-based meter determines a phase angle of the cellular meter relative to a reference device or relative to another cellular meter on the same tower based in part on the time-to-zero-crossing. In a further example, the cellular meter, a central office facility or other computing device may compare times-to-zero-crossing of meters and/or nodes associated with one cellular tower with meters associated with another tower. And further, phase angles of cellular star network-connected meters may be compared to RF or PCL mesh network-connected meters. This may be enabled by use of a meter in communication with both networks.

Transformer Phase Discovery (TPD)

Transformer phase discovery (TPD) provides information describing which electrical phase conductor is connected to a particular transformer. In some implementations, signals transmitted through PLC travel in electrical conductors, but generally do not cross transformers. Accordingly, the limitations of PCL messages may be used to determine if two meters are connected to a same transformer. That is, if the meters can communicate using PLC, they are on the same transformer.

Figure 8:
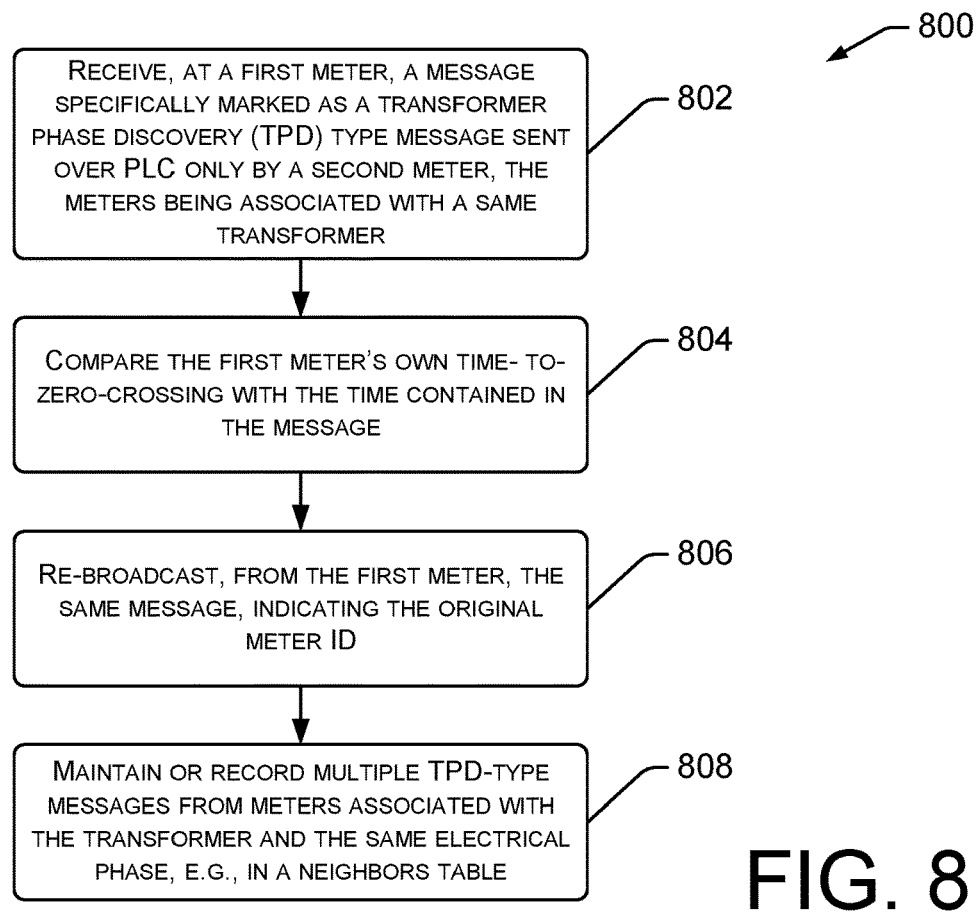
FIG. 8 is flow diagram showing example techniques for determining electrical phase usable by transformers.

FIG. 8 is flow diagram showing example techniques 800 for determining electrical phase used by transformers. A transformer phase discovery (TPD) process may be configured to determine a phase (e.g., determine a particular conductor within three-phase power) that is attached to a transformer. At block 802, the TPD process may be started with respect to each transformer by transmission of a specially or specifically marked "TPD-type" message over PLC only. The transmission may be sent by a randomly selected end-use meter that is connected to each transformer. Alternatively, a meter associated with each transformer may be selected by the use of random delays on each meter. Any meter that receives a TPD-type message may re-transmit the message, but may be constrained from initiating additional TPD-type broadcasts. Therefore, most meters on one transformer-phase may receive a TPD broadcast from the first broadcasting meter. The TPD-type message may contain the time to zero-crossing, which may be expressed in angular degrees or milliseconds, etc. At block 804, any meter that receives the TPD-type message compares its own time-to-zero-crossing with the time contained in the message. If the difference is less than ±15 degrees, the two meters can be assumed to be of the same phase, and it is likely that they are on the same transformer. At block 806, the message-receiving meter may then re-broadcast the same message, indicating the original meter ID. However, to prevent excessive transmissions, each meter may be limited to one transmission within a time-out period. The one transmission may be made either as one of the first responders to the TPD process or as a re-broadcast of a received TPD-type message.

In some implementations of the TPD process, a meter may receive multiple TPD-type messages from different meters associated with the same transformer and the same electrical phase. At block 808, this information may be maintained in a neighbors table associated with the statistical information propagation (SIP) discussed further below. Within the table, the transformer associated with the TPD process may be known only as the "parent" transformer of a particular meter that transmitted an initial TPD-type message, that is, the transformer may be known only by reference to the ID of that first broadcasting meter.

At the end of this TPD process, each meter knows of one or more sibling meters of the same phase. The absolute identity of the phase may be unknown at this stage, only its "sameness" to that of one or more "sibling meters," i.e. meters that are connected to the same transformer, may be known. In an example, meter A may know that its phase is identical to that of meters B and C from which it received TPD-type messages. Assuming that meters B and C preempted any TPD-type broadcast by A, they may not know (at this point) that they are of the same phase as meter A. It is also possible that meters B and C cannot communicate with each other. However, this unknown information may be determined and transferred to meters B and C by the SIP process, described below.

Figure 9:
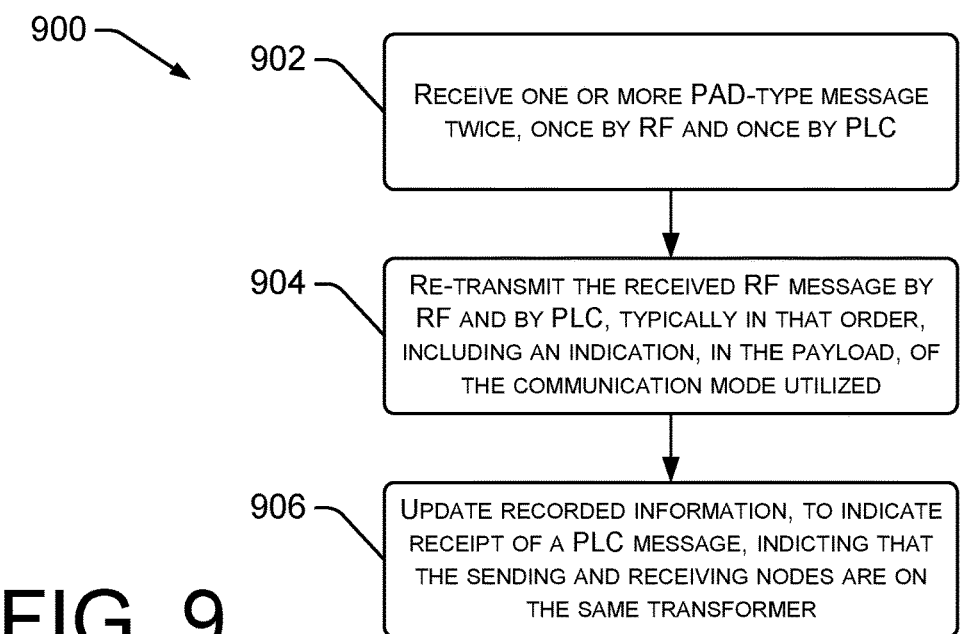
FIG. 9 is a flow diagram showing example techniques to combine the transformer phase discovery process and the phase angle determination process.

FIG. 9 shows example techniques 900 that combine the transformer phase discover (TPD) process with the phase angle determination (PAD) process. At block 902, one or more PAD-type message is transmitted twice by a first node, once by RF and once by PLC, and received at a second node. The message contents may differ only by the different communication modes (RF vs. PLC), which may be indicated within the payload. At block 904, each meter that receives the RF message retransmits it by RF and by PLC, typically in that order, and again includes the communication mode utilized within the payload of each message. At block 906, if the second PLC message is received by the same meter, that fact is processed as a "TPD-type" message and the neighbors table may be updated with the received transformer and phase information. That is, if the PLC message is received, that event would indicate that the sending and receiving meters are connected to the same transformer. However, this PLC message should not be re-broadcast.

Thus, in the example implementation of a unified PAD and TPD process, as the reference meter's original message makes its way through successive layers of re-transmitting meters, the PLC messages are received mainly by meters that are siblings to meters that transmitted the PLC messages. Thus in some examples, a single message sent by the reference meter triggers separate TPD-type processes in a meter associated with each transformer that receives the re-transmitted, original reference message.

In one example, a first meter receives a specifically marked transformer phase discovery (TPD) message sent over power line communications (PLC) by a second meter, wherein the meters are associated with a same transformer. A time-to-zero-crossing of the first meter is compared with a time contained in the message. The first meter re-broadcasts the same message, indicating the original meter ID. The first meter may maintain multiple TPD-type messages from different meters associated with the transformer and the same electrical phase. In a refinement of the example, the first meter may receive one or more PAD-type message twice, once by RF and once by PLC. The meter may re-transmit the received RF message by RF and by PLC, including an indication, in the payload, of the communication mode utilized. The meter may then update recorded information, to indicate receipt of a PLC message, and to indicate that the sending and receiving nodes are on the same transformer.

Feeder Topology Discovery (FTD)

The feeder topology discovery (FTD) techniques assist to discover the topology of electrical conductors in a smart grid. In one example, an unusual electrical event is used to determine which feeder lines were involved in the event. In one example, the FTD process may utilize a distinctive voltage event on a primary feeder, which may be related to a capacitor bank or a recloser.

Figure 10:
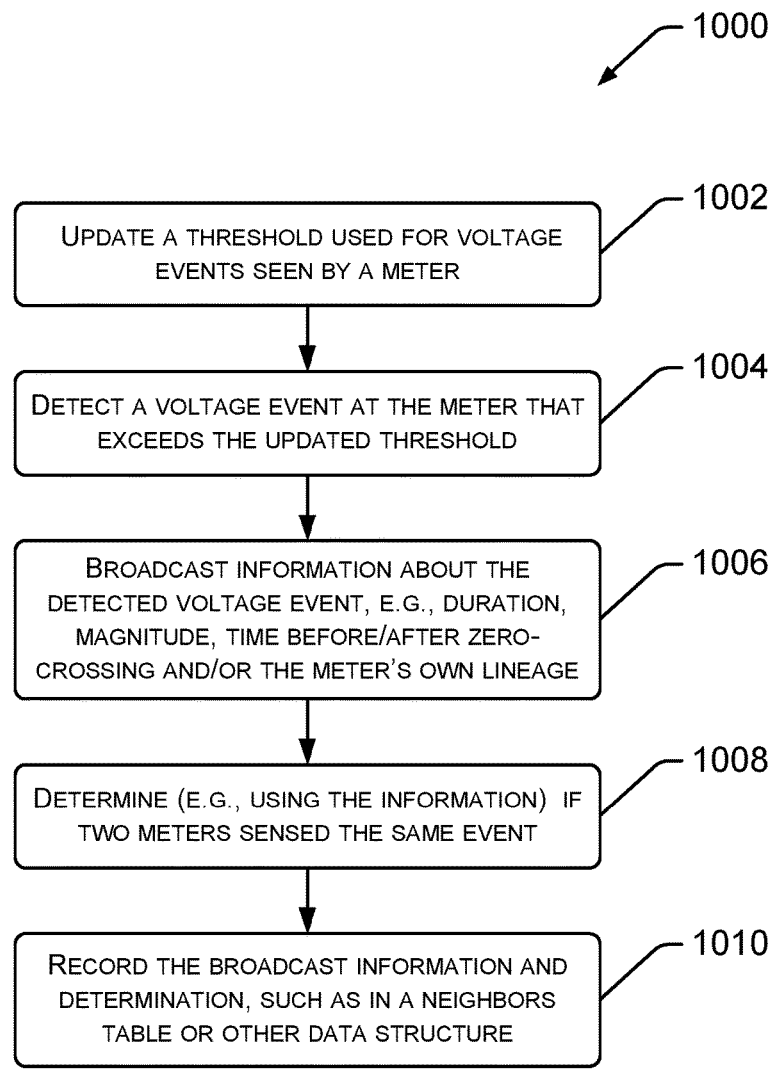
FIG. 10 is a flow diagram showing example techniques by which an electrical feeder line/conductor may be discovered and/or determined based on an electrical event.

FIG. 10 describes example techniques 1000 by which a feeder (electrical conductor for power-transmission) may be associated with meters on that feeder in the aftermath of an electrical event. The electrical event may be a low voltage event or a voltage spike event. To assist in the processes, "beacon meters" of known location and phase(s) may be placed at strategic locations, e.g., downstream of capacitors, with respect to each feeder. The beacon meters may detect the electrical event, if it exceeds a threshold value.

At block 1002, a threshold used to indicate detection of an unusual event may be periodically or occasionally updated. In one example, the threshold may be derived by computing and/or continuously updating a 99th-percentile for voltage events seen by the meter. In other examples, other thresholds may be established. The update may be recorded as a separate statistical distribution of voltage events. At block 1004, a beacon meter may detect the unusual voltage event, responsive to the event exceeding the threshold. At block 1006, upon detection of the unusual event, the meter may broadcast information about the unusual voltage event, including time, duration, magnitude, and/or time before/after zero-crossing, as well as the meter's own lineage (e.g., a feeder ID and/or a section ID). Any meter that receives the broadcast directly from the beacon meter may compare the broadcast event time with the receiving meter's own log of external voltage events. An "external" voltage event may include a voltage change sensed by the meter not accompanied by simultaneous current change of opposite sign and of magnitude consistent with the relevant impedance(s). At block 1008, existence of such a matching event is considered a "hit," in that both meters sensed the same event. At block 1010, the information may be recorded, such as in the neighbors table as discussed below in the section on statistical information propagation (SIP).

Optionally, the relative phase with respect to the beacon meter can be computed through multiple re-transmissions in a manner similar to that used in the PAD process to determine the relative phase index (MR0 to MR11) with respect to the reference meter, $M_R$.

In some implementations, beacon meters may be deployed as reference meters, i.e., meters or nodes having known phase and known location. In such implementations, the PAD and the FTD techniques could be combined and utilized. In other implementations, the TPD techniques may additionally be combined and utilized. Such combinations of processes and techniques may comprise a comprehensive network topology discovery (NTD) process. In some examples, the stand-alone PAD and TPD processes and techniques may utilize an arbitrary message schedule. In other examples, the combined processes and combined techniques could utilize a "trigger," such as random network events such as capacitor or recloser switching.

In one example, a threshold used to indicate unusual voltage events seen by a meter is updated. A voltage event that exceeds the updated threshold may be detected. Information about the detected voltage event may be broadcast. The information may include time, duration, magnitude, time before or after zero-crossing and a lineage of the meter. The meter (or other computing device) may determine, based at least in part on the broadcast information, if two meters sensed the same event. The broadcast information and the determination may be recorded.

Opportunistic Outage Evaluation (OOE)

Figure 11:
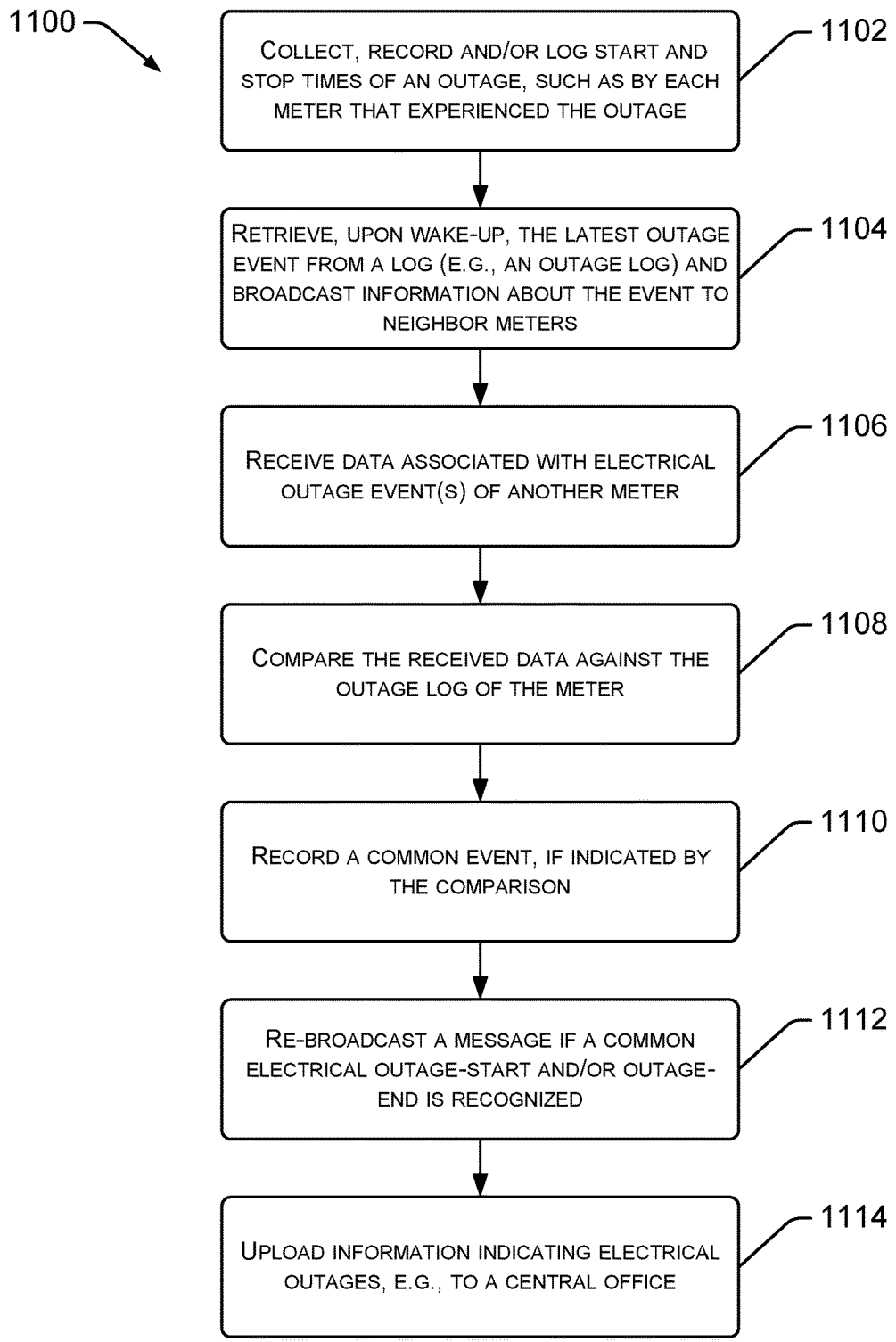
FIG. 11 is a flow diagram showing example techniques by which an electrical outage may be opportunistically utilized to obtain data.

FIG. 11 is a flow diagram showing example techniques 1100 by which an electrical outage may be opportunistically utilized to obtain data. At block 1102, meters that experience an outage may collect start and stop times of the outage in a log. Such an event may be considered a special kind of "unusual event" as discussed with respect to statistical information propagation (SIP) and may be propagated the same or similar manner. At block 1104, meters "waking up" from an outage may retrieve the latest outage event from its log and broadcast information about the event to neighbor nodes. The broadcast may be made as two separate events: an outage start (e.g., including a number keyed to the nearest minute) and an outage end (e.g., including another number keyed to the nearest minute).

At block 1106, meters may receive data associated with other meters' electrical outage events. At block 1108, the received data indicating an electrical outage event may be compared with a meter's own outage log. At block 1110, if a corresponding outage start and/or outage end is found by the comparison, this information may be recorded as a "hit," or common event in its neighbor table or other data repository. At block 1112, if a "hit" indicating a common electrical outage start and/or outage end is recognized, the broadcast message may be re-transmitted. In one example, receipt of a broadcast indicating an outage start or an outage end will stop the receiving meter from broadcasting the meter's own latest outage event, if any, unless its start and/or end times are different from those indicated in the received broadcast.

At block 1114, information indicating electrical outages may be uploaded, e.g., to a central office. The uploaded information may include outage start and stop times, and may provide valuable data for use a back office processes. For example, such information may be collated, to thereby deduce or determine network topology and other information. The uploaded information may provide data for other back office processes that may maintain customer average interruption duration index (CAIDI) and system average interruption duration index (SAIDI) statistics as well as a log of the location of the outage source.

In one example, a meter logs the start and/or stop times of an electrical outage. Upon wake-up after an outage at the meter, the meter may retrieve the latest outage event from the outage log. The meter may broadcast information about the event to neighbor nodes. The meter may receive data associated with an electrical outage event of another meter, which was similarly broadcast. The meter may compare the received data against its own outage log. The meter may record common event, if indicated by the comparison. The meter may re-broadcast a message if a common electrical outage-start and/or outage-end is recognized. The meter may upload information indicating electrical outages, e.g., to a central office.

Statistical Information Propagation (SIP)

Figure 12:
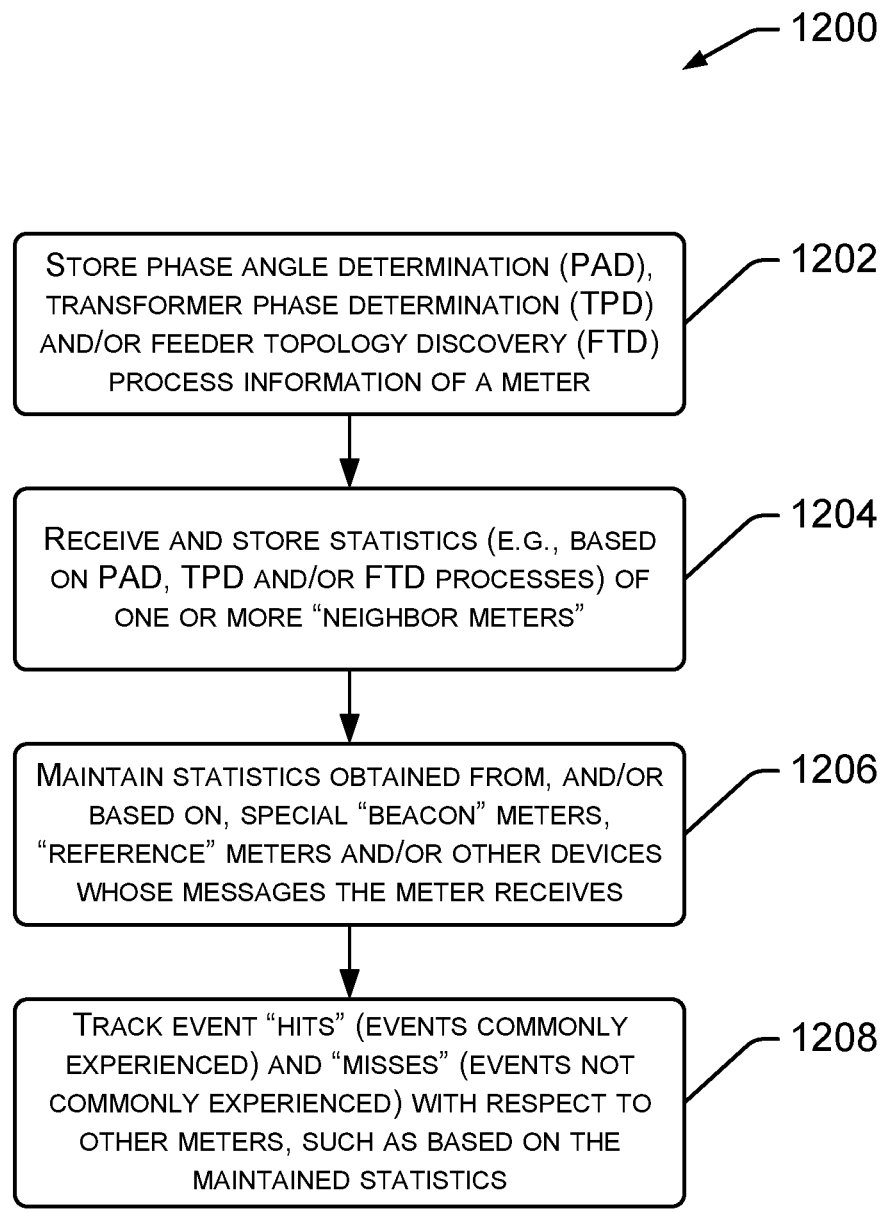
FIG. 12 shows example statistical information propagation processes and techniques that may be used to broadcast information about unusual events experienced by one or more meters.

FIG. 12 shows example statistical information propagation (SIP) processes and techniques 1200 that may be used to broadcast information about unusual events experienced by one or more meters. The broadcasts may be made between meters that are in direct communication. The SIP techniques may utilize responses from such meters to determine aspects of absolute and/or relative network topology, and phase of the responsive meters.

The SIP processes and techniques may include the transmission and propagation of information from a meter through, and/or to, other meters, nodes and network computing devices. The information may include a relative or absolute electrical phase used by the meter, the transformer associated with the meter and/or other information. The information may be used by a central office or other processing center to maintain databases that describe network topology, the electrical phases used by network devices, etc.

In one example, statistical information propagation (SIP) techniques 1200 may be configured to utilize and integrate information from one or more of the three processes including phase angle determination (PAD), transformer phase discovery (TPD), feeder topology discovery (FTD). In the example of block 1202, SIP processes may store information obtained from techniques related to a meter's own PAD, TPD and/or FTD processes.

At block 1204, each meter may additionally receive and store statistics of one or more "neighbor meters." A meter's neighbor meters may include those meters with which the meter may communicate directly (i.e., without relay by other meters). At block 1206, a meter may also keep or maintain statistics obtained from, and/or based on, special "beacon" meters, "reference" meters and/or other devices whose messages the meter receives. The meter may be separated by any number of communication hops from such meters or devices.

A meter may create a new file or record for each meter or device from which it receives data. Thereafter, statistics meters may be maintained. Accordingly, at block 1208, event "hits" (events commonly experienced) and "misses" (events not commonly experienced) may be tracked by each meter with respect to other meters that are in direct communication. The file or record may be deleted if the ratio of hits to misses drops below a threshold, or if the number of hits drops below a threshold. Accordingly, statistics may be kept on "nearest neighbors" with which the meter communicates directly, and may be used for transformer identification. Such statistics are distinguishable from statistics that may be kept on beacon and/or reference meters, from which messages are received through any number of intermediate hops. Such statistics may be used for feeder and phase identification.

In one example, a meter may store phase angle determination (PAD), transformer phase determination (TPD) and/or feeder topology discovery (FTD) processes information. The meter may receive and maintain statistics based on PAD, TPD and/or FTD processes of one or more neighbor meters. The meter may maintain statistics based on beacon meters or reference meters. The meter may track events commonly experienced with respect to other meters, based at least in part on the PAD, TPD and/or FTD information of the meter, the PAD, TPD and/or FTD information of one or more neighbor meters and the maintained statistics.

In a further example, the following statistics may be kept for each neighbor, reference, or beacon meter:
  a TimeStamp of most recently received unusual event;
  an exponentially weighted moving average (EWMA) of time elapsed since prior event;
  an EWMA of received event count;
  an EWMA of received events or event counts that are coincident with a meter's own events or event counts (e.g., a "number of hits");
  an EWMA of phase angle difference with respect to transmitting meter;
  an EWMA of source impedance;
  a parent transformer ID, if known;
  a section ID, if known;
  a feeder ID, if known; and/or
  a relative lineage, where "lineage" may include an entire chain of nodes upstream of the meter, starting with the TransformerID, and continuing with SectionID and FeederID, and may be expressed as "same as meterID."

Figure 13:
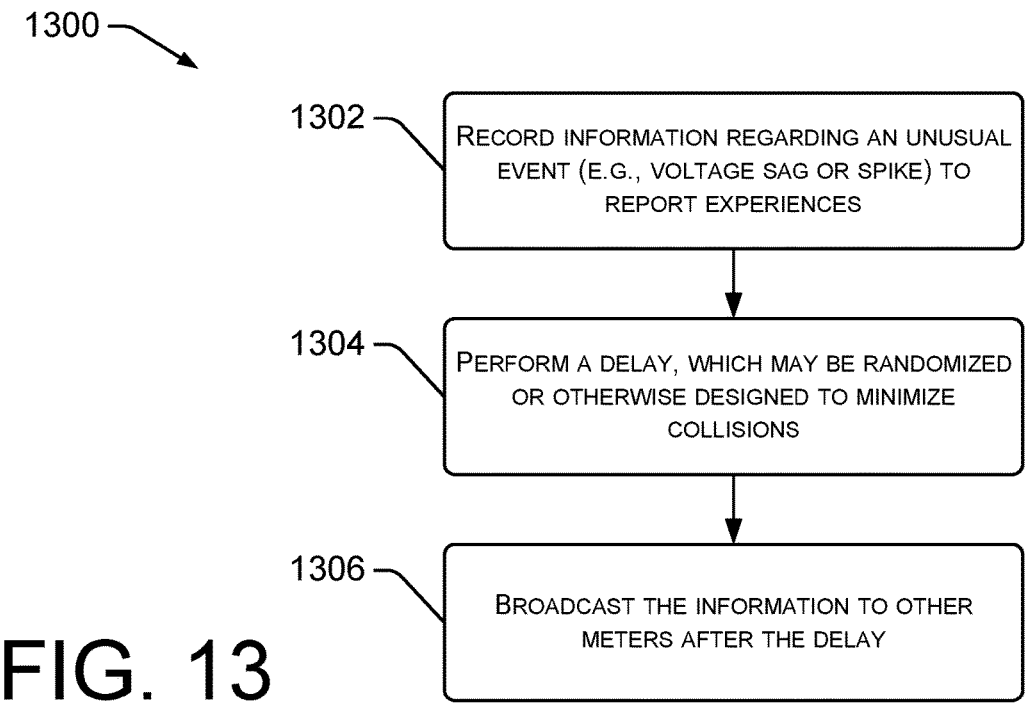
FIG. 13 shows example statistical information propagation processes and techniques that may be used to broadcast and share information between meters.

FIG. 13 shows example statistical information propagation (SIP) processes and techniques 1300 that may be used to broadcast and share information between meters. At block 1302, after an unusual event (e.g., voltage sag or spike) is experienced by a meter, information related to the event may be recorded for later broadcast to other meters. At block 1304, a brief (e.g., random) delay may be designed to minimize collisions with other meters that may experience the same event and broadcast their versions of it. At block 1306, the information is broadcast to other meters after the delay.

In one example, information related to the unusual event may be processed into data structures or files on the meter or node. The information may include some or all of the following elements, if known:

- A parent transformer ID. A TPD process may be used to group meters by transformer and/or phase. The TPD process may group meters by transformer and phase using an arbitrary labeling of transformers. The process of relating such arbitrary labels to utility-specific transformer IDs may be performed by a back-office process. As individual transformers are conclusively identified by their utility-specific ID, that ID may then be propagated to the linked meters by peer-to-peer communication from a collection engine (CE).
- A section ID. As transformers are identified, sections may also be identified. Section ID information may propagated from the CE.
- A feeder ID. As transformers and sections are identified, feeders may also be identified. The CE may assign a final feeder ID using peer-to-peer communication with each meter.
- Relative lineage may be expressed as "same as <meter ID>".
- An electrical phase.
- A relative phase may be expressed using nomenclature, such as (<Meterid><PhaseIndex>), which may be based on PAD.
- An ongoing log of notable events.
- A continuous histogram (or other data structure) of self-induced voltage events (e.g., EWMAs binned by voltage change). In an example, the histogram or other data structure may start with a bin size of 0.1 volt. As time progresses and a range of voltage-change values emerges empirically, the histogram bin size could be increased, such as with an objective of maintaining between 10 and 20 actual bins. "Legacy" values for smaller bin sizes can be combined into the larger bin sizes provided the latter are formed of an integer number of smaller bin sizes. Self-induced voltage events are those that are directly related to a current change of opposite sign measured at the same meter, with the ratio of voltage change divided by the negative of current change close to the measured source impedance of the meter.
- A continuous histogram (or other data structure) of external voltage events (e.g., EWMAs binned by voltage change). External voltage events are those that the meter experiences without a corresponding current change measured at the meter itself. Typical examples include an appliance turning on or off at a meter attached to the same transformer as another meter, or a capacitor or recloser switching upstream of the meter's parent transformer.

Meters receiving data transmission(s) including some or all of the above elements may compare the event described by the received data to their own event log. If the same event is present in their log, or if there is a file for the event-broadcasting meter and the number of "hits" exceeds the given threshold, then the received event may be added to the accumulated statistics. If the received event is not found in the log of a meter and, by adding the received event to the statistics of a meter, the number of "hits" drops below the given threshold, the file associated with the event-broadcasting meter may be deleted from the meter. If the received event is not found in the log and no file for the event-broadcasting meter exists, no action is indicated.

SIP for Cellular Meters

In many implementations, cellular meters cannot communicate directly with other meters. In those implementations, alternate methods of communication between meters may be utilized.

Figure 14:
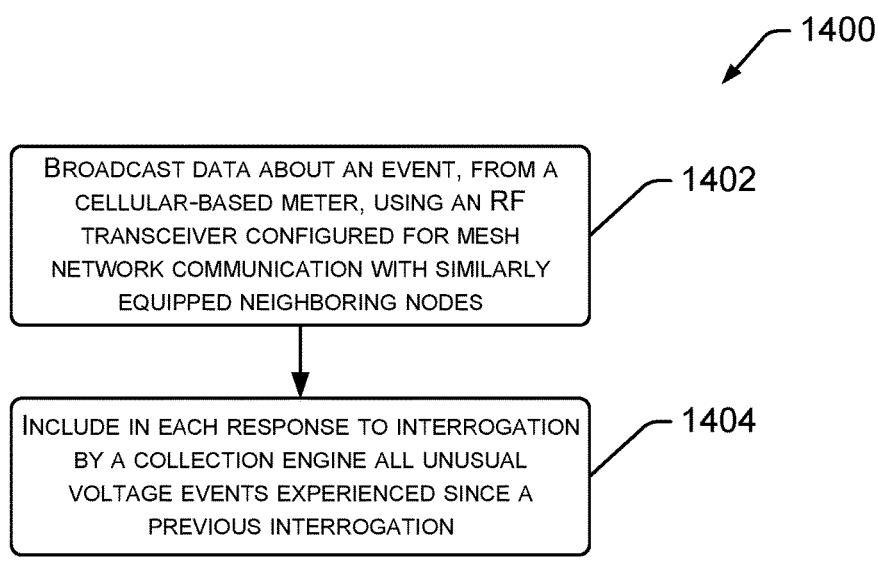
FIG. 14 is a flow diagram showing example techniques for statistical information propagation using cellular meters.

FIG. 14 is a flow diagram showing example techniques 1400 for statistical information propagation using cellular meters. In a first method to implement such communication, an inexpensive RF transceiver is added to cellular meters to enable transmission and reception of broadcasts between nearby meters. Such transceivers may enable formation of a mesh network to complement the cellular-based meters use of a star network. At block 1402, a cellular meter experiencing an unusual voltage event broadcasts data about the event using the RF transceiver to similarly equipped neighboring nodes. This method effectively provides a mesh network to cellular-equipped meters and SIP functionality equivalent to that provided by a mesh network.

At block 1404, each cellular meter may include in each response to interrogation by the collection engine (CE) (e.g., located in a utility company office) all unusual voltage events that had been experienced since the previous interrogation. Such responses to the interrogation may be made by operation of the cellular-based star network. This information could be used in the office, or the CE could provide this information to meters in the neighborhood of the cellular meter that reported the information.

Back-office Processes

It is important for back-office processes to be able to understand the topology of the electrical network. Understanding the topology may include understanding the network devices (e.g., electric meters, transformers, conductors, substations, etc.), how they are electrically connected, the phase(s) used by each device, etc. An understanding of network topology is important to many of the software applications that add value to the smart grid. Accordingly, it is important to be able to reconcile contradictory information, and to discover and correct errors in maps or databases expressing the network topology. The techniques, methods and device/network configurations discussed herein may be utilized to provide an improved or complete understanding of network topology.

Once the network topology is thought to be fully or sufficiently understood, actual and/or absolute phase and lineage information may be transmitted to meters and/or other network devices. Such information may be utilized by the network devices, such as by software applications operating on smart electrical meters.

As part of response(s) to interrogation by a CE, each meter may transmit its latest topological-related information, particularly if it differs from the most recent previous transmission. Some information may be relative, for example, a meter may indicate that its phase is another meter's phase plus or minus N phase index values (e.g., degrees). Or it may indicate that its lineage is the same as that of another meter.

In one example, a CE may interrogate a plurality of meters, such as by processing meter message or packet headers in the order received. If a header references another meter, the referencing and referenced meter IDs may be entered into one or both of two linking tables, e.g., a "PhaseLink" table and a "LineageLink" table, both of which may include the following data and/or columns:

ReferencedMeterID, i.e., an ID of meter whose properties are being referenced.

ReferringMeterID, i.e., an ID of a meter whose properties are expressed in relation to another meter.

AsOfDateTime, i.e., a TimeStamp of when this information changed in referring meter.

After interrogation by the CE of a group of meters and/or network nodes is complete, the newly uploaded entries in the two tables may be merged with previous entries. A property propagation process may be performed.

Figure 15:
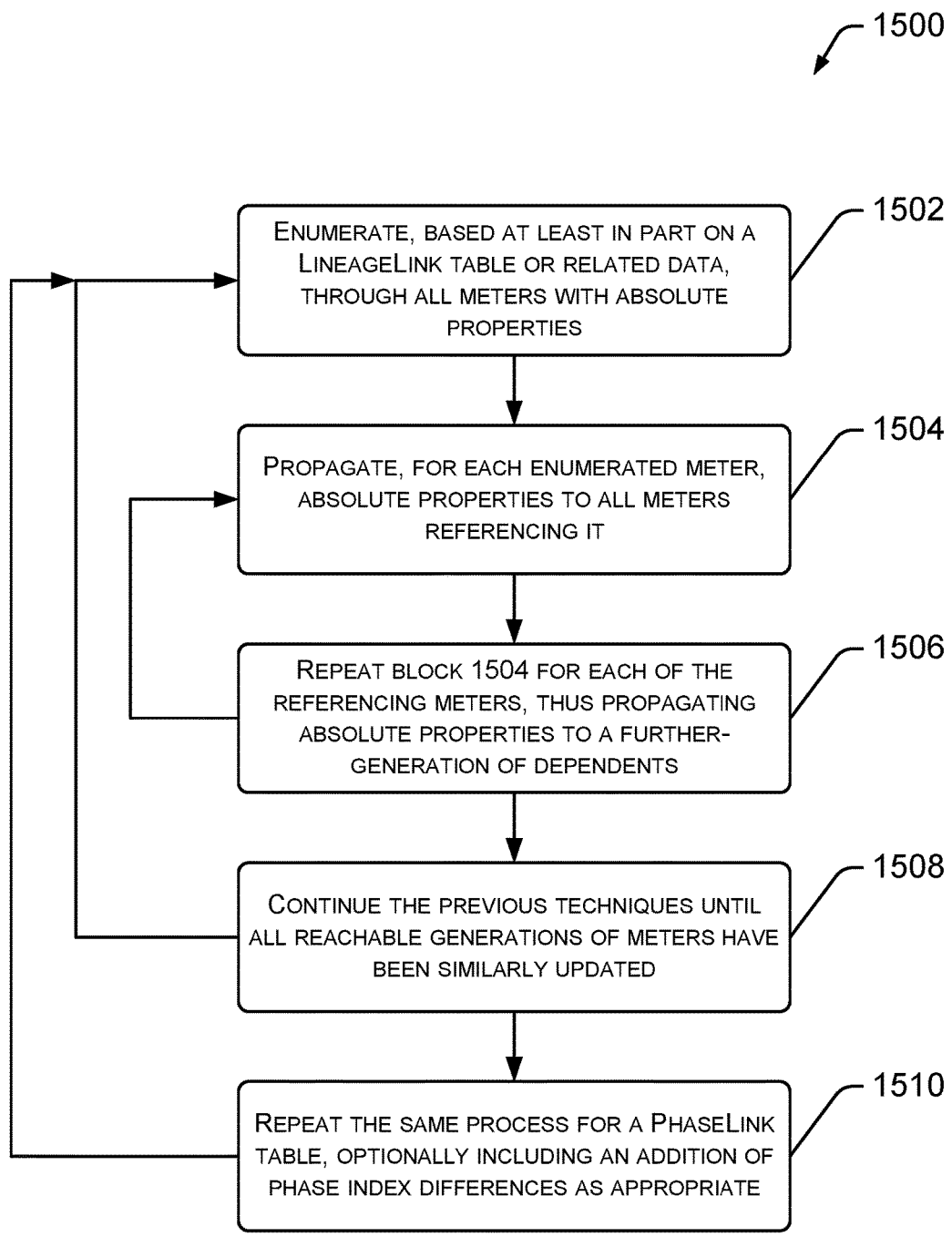
FIG. 15 is a flow diagram showing example techniques by which a collection engine in a back office may interrogate a group of meters.

FIG. 15 shows example techniques 1500 by which a collection engine (CE) in a back office may interrogate a group of meters. At block 1502, based at least in part on a LineageLink table or related data, enumerate through, or otherwise count, quantify, examine or calculate aspects of, all meters with absolute properties. At block 1504, for each enumerated meter, propagate absolute properties to all meters referencing it. At block 1506, repeat block 1504 for each of the referencing meters, thus propagating absolute properties to a second-generation of dependents. At block 1508, continue the previous techniques until all reachable generations of meters have been similarly updated. At block 1510, repeat the same process for a PhaseLink table, optionally including an addition of phase index differences as appropriate.

Example "Spokes Meter" Selection

If an unusual voltage event is detected, meters that detected the event may broadcast an indication of their detection, a nature of the event, a time of the event, etc. However, meters that experienced the unusual voltage event may be configured to abort their broadcast if they receive notice of the same event from another meter before they transmit.

Each meter that receives such a broadcast may compare information in the broadcast to its own log of unusual events. If no corresponding event found, the meter may end activity with respect to the event (e.g., it may skip all steps that follow). However, each meter that receives a broadcast with a notice of an unusual external event, and successfully finds that event in its own event log, may re-broadcast the notice of the event. To cut down on network traffic, each meter will filter out, and not re-broadcast, any "echoes" of its own previous broadcast.

If a meter detects an external event and also receives a broadcast associated with the same event, the meter may be configured to re-broadcast the broadcast heard from the other meter rather than broadcast its own message associated with the unusual event.

Meters that detect an unusual external event (e.g., voltage sag or spike) or that receive a broadcast from another meter that is confirmed by meter's own event log, may notify the head end (e.g., central office, or other authority) of that event.

The head end may perform a number of functions or procedures to add value to data from network elements. For example, the head end may merge different events, which may at one time have been thought to be potentially distinguishable, but which occurred at the same time, into a single event. The head end may group incoming event notifications by event ID and transformer ID. Additionally, the head end may identify and record each transformer participating in, or recognizing, an event. The head end may store the ID numbers of transformers associated with different events. Additionally, the head end may store a number of, and/or listing of the identities of, meters associated with each transformer that participates in, or that recognizes, the event.

As data associated with voltage events accumulate, the head end may compile data describing a number of events associated with each of a plurality of transformers.

The head end may determine how sections of electrical conductors are configured within the network topology. In one example, for each new electrical event, the head end may consider all transformers with no prior events to be linked by one or more sections. For each new event, each time a transformer without prior outages appears in the accumulation, the head end may analyze the transformer data. For example, the head end may identify other transformers participating in the same, recent event. The head end may determine which of the identified transformers are likely linked by sections within the topology. The head end may organize other transformers within a data structure according to an order of increasing outages experienced.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
sending a broadcast timing signal to a plurality of meters;
receiving a first difference value and a second difference value, from a first meter and a second meter, respectively, wherein the first difference value and the second difference value are based on elapsed time between the broadcast timing signal and a first zero-crossing time of the first meter and a second zero-crossing time of the second meter, respectively;
determining a phase of a power line to which each of the first meter and the second meter are connected, using the first difference value and the second difference value, respectively;
receiving data describing a first voltage event and receiving data describing a second voltage event, occurring at the first meter and the second meter, respectively;
comparing the data describing the first voltage event and the data describing the second voltage event; and
determining, based at least in part on the comparing, and based at least in part on the phase of the power line to which each of the first meter and the second meter are connected, if the first voltage event and the second voltage event are the same event.

2. The method of claim 1, wherein the method additionally comprises:
refreshing data indicating the phase of the power line to which each of the first meter and the second meter are connected;
wherein the refreshing increases accuracy of smart grid analytics software applications running on a server performing the method.

3. The method of claim 1, wherein the broadcast timing signal is sent by a first cellular tower, and the method additionally comprises:
sending a second broadcast timing signal from a second cellular tower;
determining respective phases to which each of a plurality of meters are connected, using the second broadcast timing signal; and
providing the determined respective phases of each of the plurality of meters to an analytics software application running on a server.

4. The method of claim 1, wherein the broadcast timing signal is sent by a cellular tower, and the method additionally comprises:
receiving data from a meter in communication with the cellular tower and in communication with a mesh network; and
determining phases to which each of a plurality of meters on the mesh network are connected based in part on the received data.

5. The method of claim 1, wherein the broadcast timing signal is sent by a first cellular tower, and the method additionally comprises:
collecting data obtained by at least one of the plurality of meters, wherein the data is obtained using a mesh network to which the at least one of the plurality of meters is connected.

6. The method of claim 1, wherein the method additionally comprises:
resetting a threshold to which voltage events are compared, wherein the threshold is based on a ranking of voltage events seen by metrology devices associated with the plurality of meters; and
detecting the first voltage event exceed the reset threshold.

7. The method of claim 1, wherein the first difference value and the second difference value are expressed as a period of time or a phase angle.

8. One or more computer-readable media storing computer-executable instructions that, when executed, cause one or more processors to perform acts comprising:
sending a broadcast timing signal to a plurality of meters;
receiving a first difference value and a second difference value, from a first meter and a second meter, respectively, wherein the first difference value and the second difference value are based on elapsed time between the broadcast timing signal and a first zero-crossing time of the first meter and a second zero-crossing time of the second meter, respectively;
determining a phase of a power line to which each of the first meter and the second meter are connected, using the first difference value and the second difference value, respectively;
receiving data describing a first voltage event and receiving data describing a second voltage event, occurring at the first meter and the second meter, respectively;
comparing the data describing the first voltage event and the data describing the second voltage event; and
determining, based at least in part on the comparing, and based at least in part on the phase of the power line to which each of the first meter and the second meter are connected, if the first voltage event and the second voltage event are the same event.

9. One or more computer-readable media as recited in claim 8, wherein the acts additionally comprise:
refreshing data indicating the phase of the power line to which each of the first meter and the second meter are connected;
wherein the refreshing increases accuracy of smart grid analytics software applications running on a server performing the method.

10. One or more computer-readable media as recited in claim 8, wherein the broadcast timing signal is sent by a first cellular tower, and the acts additionally comprise:
sending a second broadcast timing signal from a second cellular tower;
determining respective phases to which each of a plurality of meters are connected, using the second broadcast timing signal; and
providing the determined respective phases of each of the plurality of meters to an analytics software application running on a server.

11. One or more computer-readable media as recited in claim 8, wherein the broadcast timing signal is sent by a cellular tower, and the acts additionally comprise:
receiving data from a meter in communication with the cellular tower and in communication with a mesh network; and
determining phases to which each of a plurality of meters on the mesh network are connected based in part on the received data.

12. One or more computer-readable media as recited in claim 8, wherein the broadcast timing signal is sent by a first cellular tower, and the acts additionally comprise:
collecting data obtained by at least one of the plurality of meters, wherein the data is obtained using a mesh network to which the at least one of the plurality of meters is connected.

13. One or more computer-readable media as recited in claim 8, wherein the acts additionally comprise:
resetting a threshold to which voltage events are compared, wherein the threshold is based on a ranking of voltage events seen by metrology devices associated with the plurality of meters; and
detecting the first voltage event exceed the reset threshold.

14. One or more computer-readable media as recited in claim 8, wherein the first difference value and the second difference value are expressed as a period of time or a phase angle.

15. A computing device, configured to perform acts comprising:
sending a broadcast timing signal to a plurality of meters;
receiving a first difference value and a second difference value, from a first meter and a second meter, respectively, wherein the first difference value and the second difference value are based on elapsed time between the broadcast timing signal and a first zero-crossing time of the first meter and a second zero-crossing time of the second meter, respectively;
determining a phase of a power line to which each of the first meter and the second meter are connected, using the first difference value and the second difference value, respectively;
receiving data describing a first voltage event and receiving data describing a second voltage event, occurring at the first meter and the second meter, respectively;
comparing the data describing the first voltage event and the data describing the second voltage event; and
determining, based at least in part on the comparing, and based at least in part on the phase of the power line to which each of the first meter and the second meter are connected, if the first voltage event and the second voltage event are the same event.

16. The computing device of claim 15, wherein the acts additionally comprise:
refreshing data indicating the phase of the power line to which each of the first meter and the second meter are connected;
wherein the refreshing increases accuracy of smart grid analytics software applications running on a server performing the method.

17. The computing device of claim 15, wherein the broadcast timing signal is sent by a first cellular tower, and the acts additionally comprise:

sending a second broadcast timing signal from a second cellular tower;

determining respective phases to which each of a plurality of meters are connected, using the second broadcast timing signal; and providing the determined respective phases of each of the plurality of meters to an analytics software application running on a server.

18. The computing device of claim 15, wherein the broadcast timing signal is sent by a cellular tower, and the acts additionally comprise:

receiving data from a meter in communication with the cellular tower and in communication with a mesh network; and determining phases to which each of a plurality of meters on the mesh network are connected based in part on the received data.

19. The computing device of claim 15, wherein the broadcast timing signal is sent by a first cellular tower, and the acts additionally comprise:

collecting data obtained by at least one of the plurality of meters, wherein the data is obtained using a mesh network to which the at least one of the plurality of meters is connected.

20. The computing device of claim 15, wherein the acts additionally comprise:

resetting a threshold to which voltage events are compared, wherein the threshold is based on a ranking of voltage events seen by metrology devices associated with the plurality of meters; and detecting the first voltage event exceed the reset threshold.

* * * * *